US012690446B2

(12) United States Patent
Lai et al.

(10) Patent No.: US 12,690,446 B2
(45) Date of Patent: Jul. 21, 2026

(54) SEMICONDUCTOR DEVICE INCLUDING THROUGH VIA AND METHOD OF MAKING

(71) Applicant: TAIWAN SEMICONDUCTOR MANUFACTURING COMPANY, LTD., Hsinchu (TW)

(72) Inventors: Chih-Yu Lai, Hsinchu (TW); Chih-Liang Chen, Hsinchu (TW); Chi-Yu Lu, Hsinchu (TW); Chung-Hsing Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 565 days.

(21) Appl. No.: 17/727,504

(22) Filed: Apr. 22, 2022

(65) Prior Publication Data

US 2023/0343703 A1 Oct. 26, 2023

(51) Int. Cl.
*H10W 20/43* (2026.01)
*H10W 20/00* (2026.01)
*H10W 20/20* (2026.01)
*H10W 20/40* (2026.01)
*H10W 20/41* (2026.01)
*H10W 20/42* (2026.01)

(52) U.S. Cl.
CPC ......... *H10W 20/43* (2026.01); *H10W 20/023* (2026.01); *H10W 20/20* (2026.01); *H10W 20/213* (2026.01); *H10W 20/40* (2026.01); *H10W 20/42* (2026.01); *H10W 20/422* (2026.01); *H10W 20/435* (2026.01)

(58) Field of Classification Search
CPC ............... H01L 23/481; H01L 23/5384; H01L 2223/66616–6622; H01L 21/76898; H01L 21/486; H10W 20/20; H10W 20/213; H10W 20/40; H10W 20/42; H10W 20/422; H10W 20/435; H10W 20/438
See application file for complete search history.

(56) References Cited

U.S. PATENT DOCUMENTS 6,225,651 B1 * 5/2001 Billon .................. H10D 12/031
257/190
7,968,460 B2 * 6/2011 Kirby ............... H01L 21/76802
257/E21.627

(Continued)

FOREIGN PATENT DOCUMENTS

TW 202121618 6/2021
TW 202213787 4/2022

*Primary Examiner* — David A Zarneke
(74) *Attorney, Agent, or Firm* — Hauptman Ham, LLP

(57) ABSTRACT

A semiconductor device includes a substrate. The semiconductor device further includes a conductive mesh on a first side of the substrate. The semiconductor device further includes an active region on a second side of the substrate, wherein the first side of the substrate is opposite to the second side of the substrate. The semiconductor device further includes a through via electrically connected to the conductive mesh, wherein the through via extends through the substrate. The semiconductor device further includes a contact structure on the second side of the substrate, wherein the contact structure is electrically connected to the active region, the contact structure is in direct contact with the through via, and the contact structure overlaps a top surface of the through via in a top view.

20 Claims, 30 Drawing Sheets

(56) References Cited

U.S. PATENT DOCUMENTS

| | | | | |
|---|---|---|---|---|
| 8,264,065 B2 * | 9/2012 | Su | H01L 23/62 | |
| | | | 257/E21.597 | |
| 8,440,554 B1 * | 5/2013 | Hiner | H01L 24/03 | |
| | | | 438/584 | |
| 8,552,470 B2 * | 10/2013 | Chen | H10F 71/121 | |
| | | | 420/451 | |
| 8,592,991 B2 * | 11/2013 | Lee | H01L 25/0657 | |
| | | | 257/774 | |
| 8,624,324 B1 * | 1/2014 | Chen | H10D 30/797 | |
| | | | 257/E21.177 | |
| 8,716,867 B2 * | 5/2014 | Ko | H01L 23/5328 | |
| | | | 257/773 | |
| 8,749,028 B2 * | 6/2014 | Aoki | H01L 21/76898 | |
| | | | 257/621 | |
| 8,786,058 B2 * | 7/2014 | Han | H01L 23/147 | |
| | | | 257/774 | |
| 8,810,010 B2 * | 8/2014 | Kim | H01L 23/481 | |
| | | | 257/653 | |
| 8,883,541 B2 * | 11/2014 | Chen | H01L 21/26506 | |
| | | | 257/E21.546 | |
| 8,907,410 B2 * | 12/2014 | Kothandaraman | H10D 64/519 | |
| | | | 257/329 | |
| 8,957,526 B2 * | 2/2015 | Chun | H01L 24/03 | |
| | | | 257/774 | |
| 9,030,014 B2 * | 5/2015 | Kawamura | H01L 21/28568 | |
| | | | 257/773 | |
| 9,048,151 B2 * | 6/2015 | Chen | H10F 77/211 | |
| 9,202,767 B2 * | 12/2015 | Kim | H01L 23/36 | |
| 9,355,935 B2 * | 5/2016 | Chen | H10D 30/792 | |
| 9,379,199 B2 * | 6/2016 | Miyazaki | H10D 84/038 | |
| 9,536,837 B2 * | 1/2017 | Lamy | H01L 23/481 | |
| 9,543,233 B2 * | 1/2017 | Liu | H01L 23/3114 | |
| 9,786,592 B2 * | 10/2017 | Lin | H01L 21/76805 | |
| 9,806,004 B2 * | 10/2017 | Lee | H01L 23/5226 | |
| 9,847,276 B2 * | 12/2017 | Kang | H01L 21/76898 | |
| 9,859,191 B2 * | 1/2018 | Lee | H01L 21/76831 | |
| 10,103,098 B2 * | 10/2018 | Jung | H01L 21/76898 | |
| 10,505,034 B2 * | 12/2019 | Yang | H10D 30/668 | |
| 11,398,431 B2 * | 7/2022 | Chang | H01L 23/5386 | |
| 11,688,667 B2 * | 6/2023 | Ma | H01L 25/50 | |
| | | | 257/774 | |
| 2009/0051039 A1 * | 2/2009 | Kuo | H01L 23/481 | |
| | | | 257/E23.145 | |
| 2009/0294911 A1 * | 12/2009 | Pagaila | H01L 24/18 | |
| | | | 257/E23.141 | |
| 2010/0038800 A1 * | 2/2010 | Yoon | H01L 23/481 | |
| | | | 257/E21.597 | |
| 2010/0130002 A1 * | 5/2010 | Dao | H01L 23/481 | |
| | | | 257/E21.495 | |
| 2010/0140805 A1 * | 6/2010 | Chang | H01L 24/16 | |
| | | | 257/E21.538 | |
| 2010/0283130 A1 * | 11/2010 | Nishio | H01L 21/76898 | |
| | | | 257/E21.597 | |
| 2011/0165776 A1 * | 7/2011 | Hsu | H01L 23/481 | |
| | | | 257/E21.597 | |
| 2012/0326320 A1 * | 12/2012 | Hong | H01L 21/76898 | |
| | | | 257/770 | |
| 2013/0288401 A1 * | 10/2013 | Matsuura | H10D 30/015 | |
| | | | 438/14 | |
| 2017/0200675 A1 * | 7/2017 | Jung | H01L 23/53295 | |
| 2017/0221861 A1 * | 8/2017 | Yu | H01L 21/76895 | |
| 2017/0345713 A1 * | 11/2017 | Chun | H01L 21/76841 | |
| 2018/0204803 A1 * | 7/2018 | Herdt | H01L 23/481 | |
| 2021/0043557 A1 * | 2/2021 | Lee | H01L 23/5385 | |
| 2021/0233853 A1 * | 7/2021 | Chang | H01L 23/5384 | |
| 2022/0302066 A1 * | 9/2022 | Cho | H01L 23/3135 | |
| 2023/0326831 A1 * | 10/2023 | Na | H10D 30/014 | |

* cited by examiner

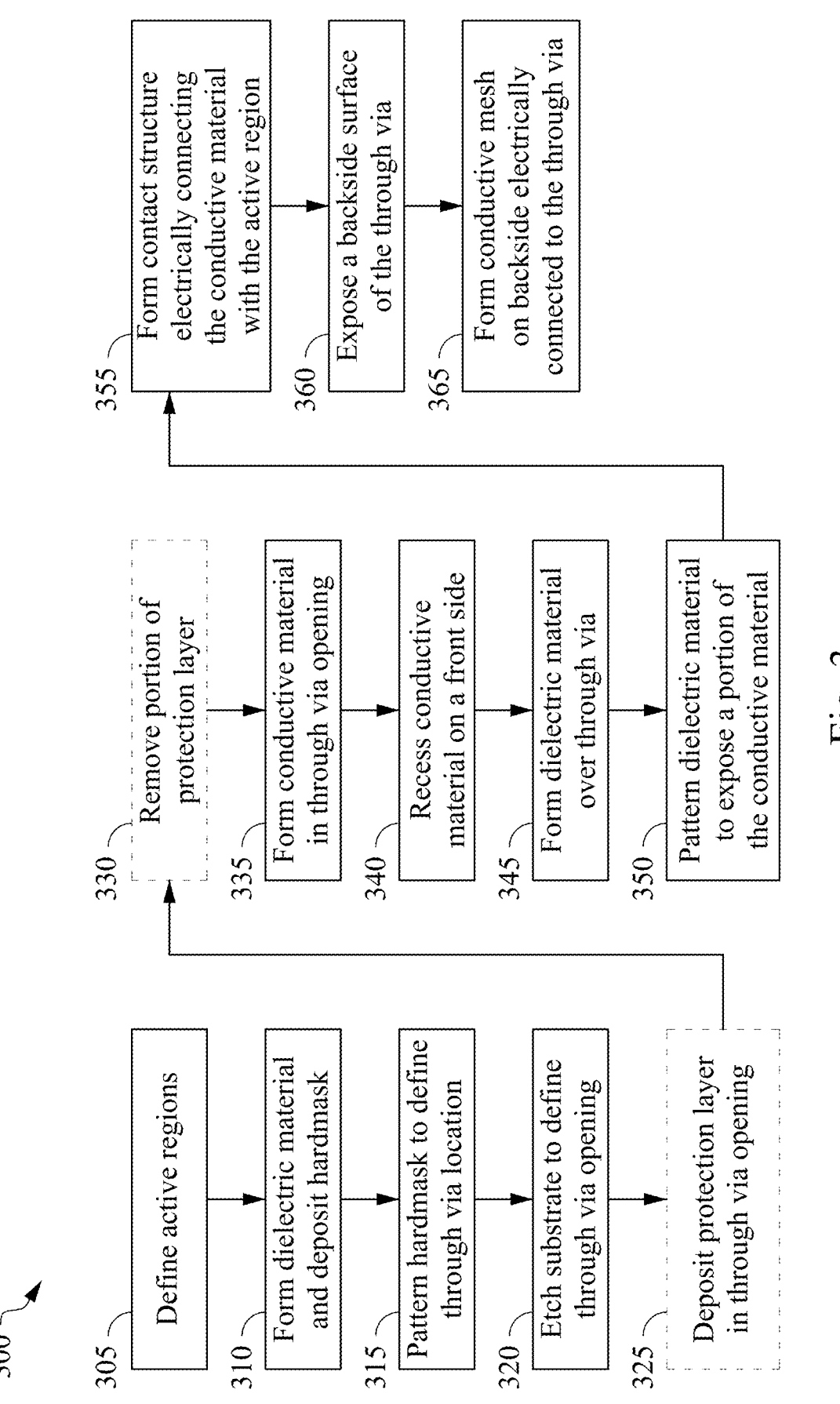

300

305 Define active regions

310 Form dielectric material and deposit hardmask

315 Pattern hardmask to define through via location

320 Etch substrate to define through via opening

325 Deposit protection layer in through via opening

330 Remove portion of protection layer

335 Form conductive material in through via opening

340 Recess conductive material on a front side

345 Form dielectric material over through via

350 Pattern dielectric material to expose a portion of the conductive material

355 Form contact structure electrically connecting the conductive material with the active region 360 Expose a backside surface of the through via 365 Form conductive mesh on backside electrically connected to the through via

Fig. 3

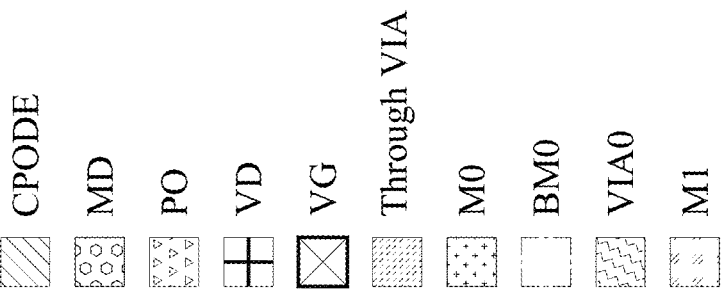
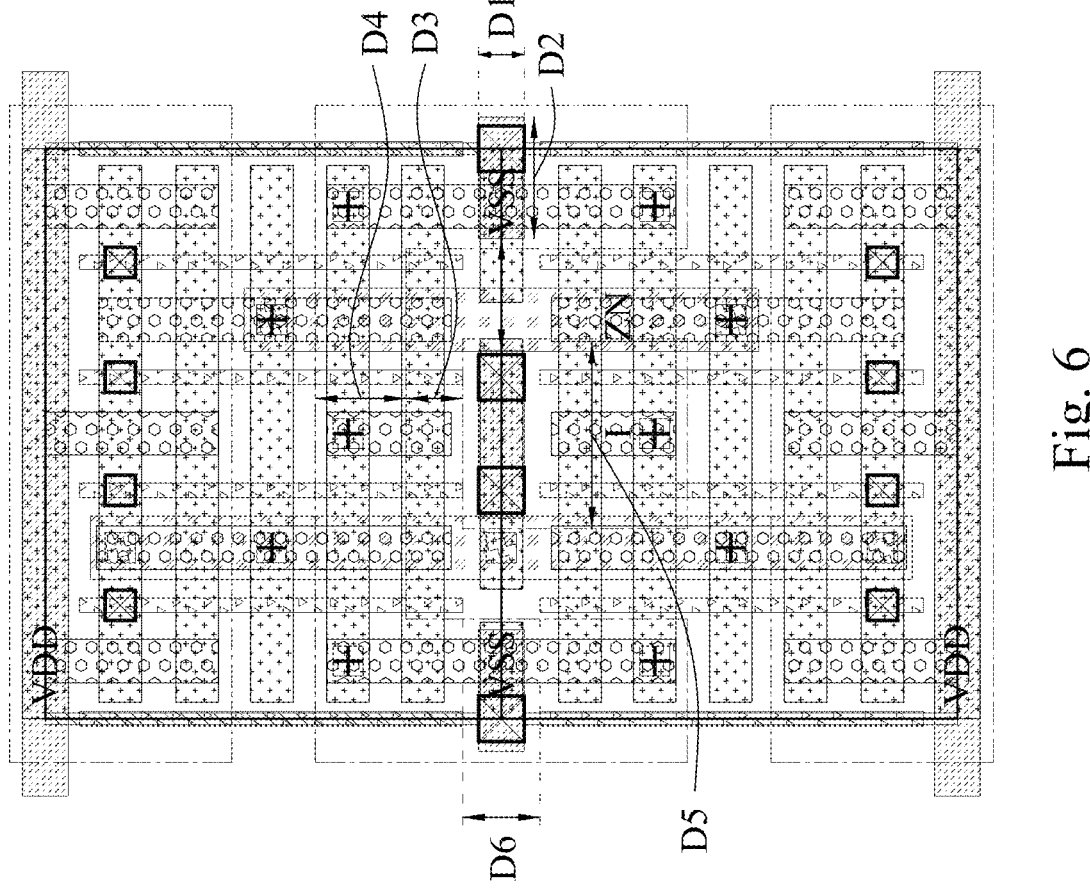
Fig. 6

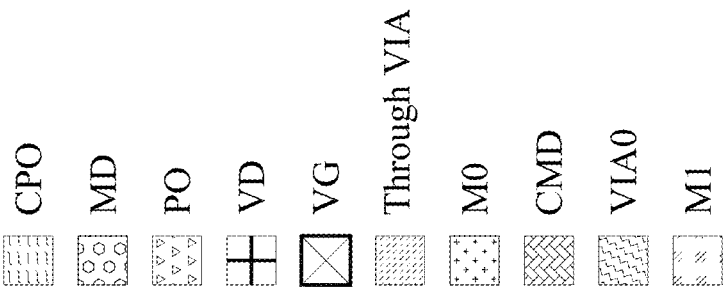
CPO
MD
PO
VD
VG
Through VIA
M0
CMD
VIA0
M1
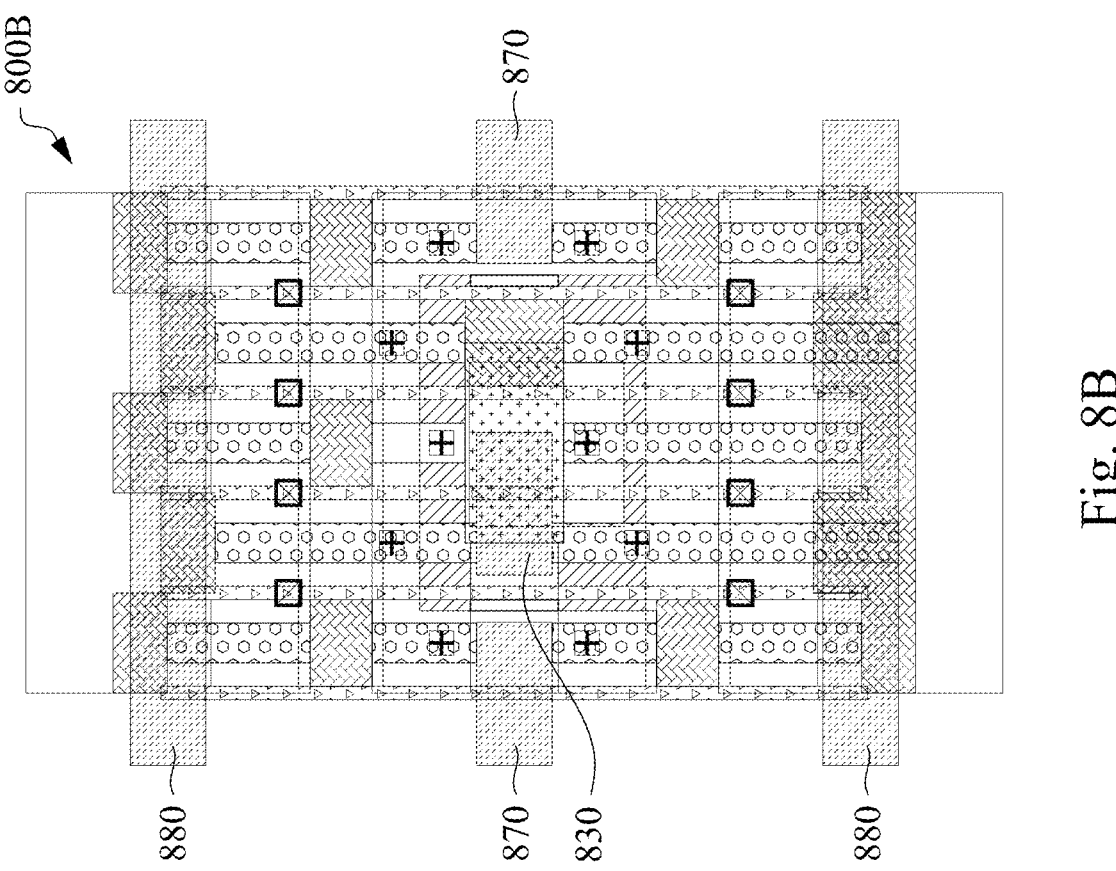
Fig. 8B

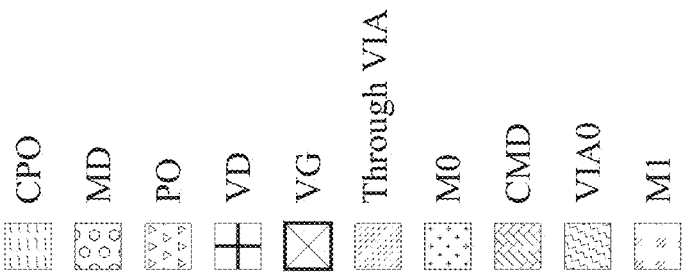
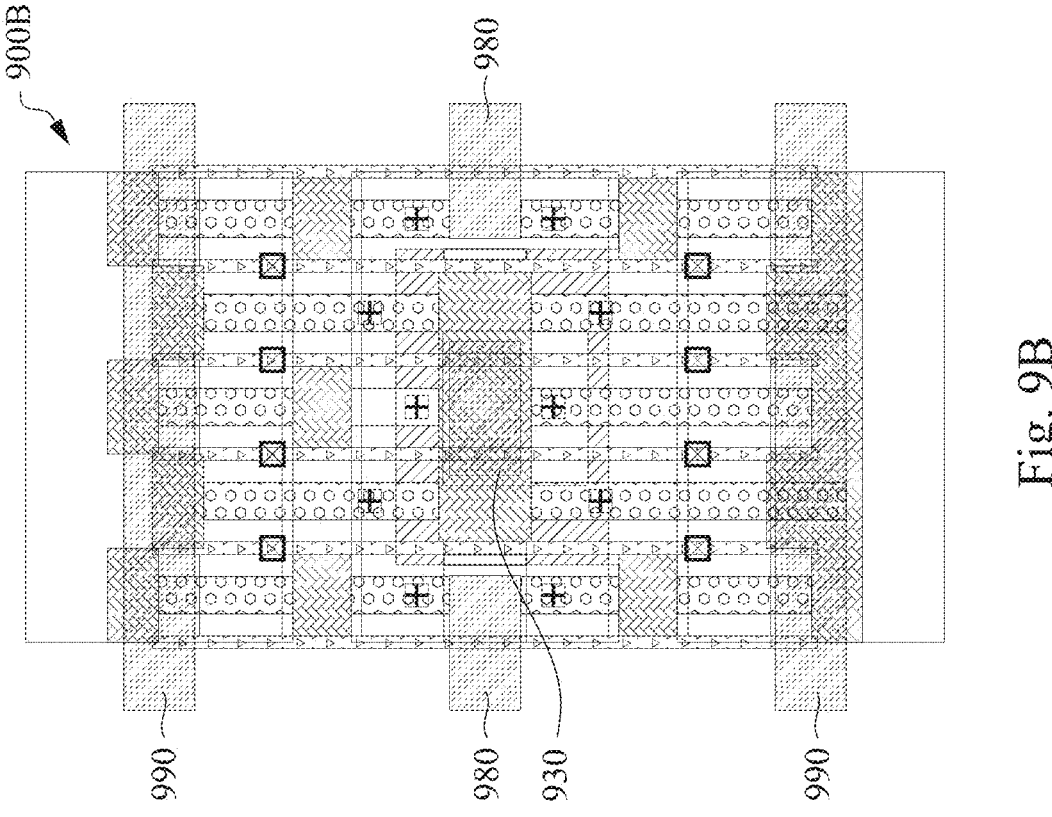
Fig. 9B

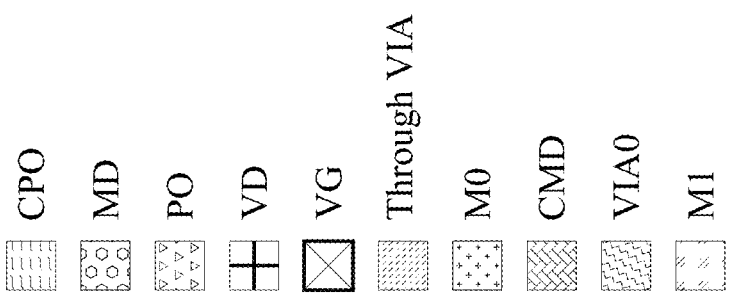
CPO
MD
PO
VD
VG
Through VIA
M0
CMD
VIA0
M1
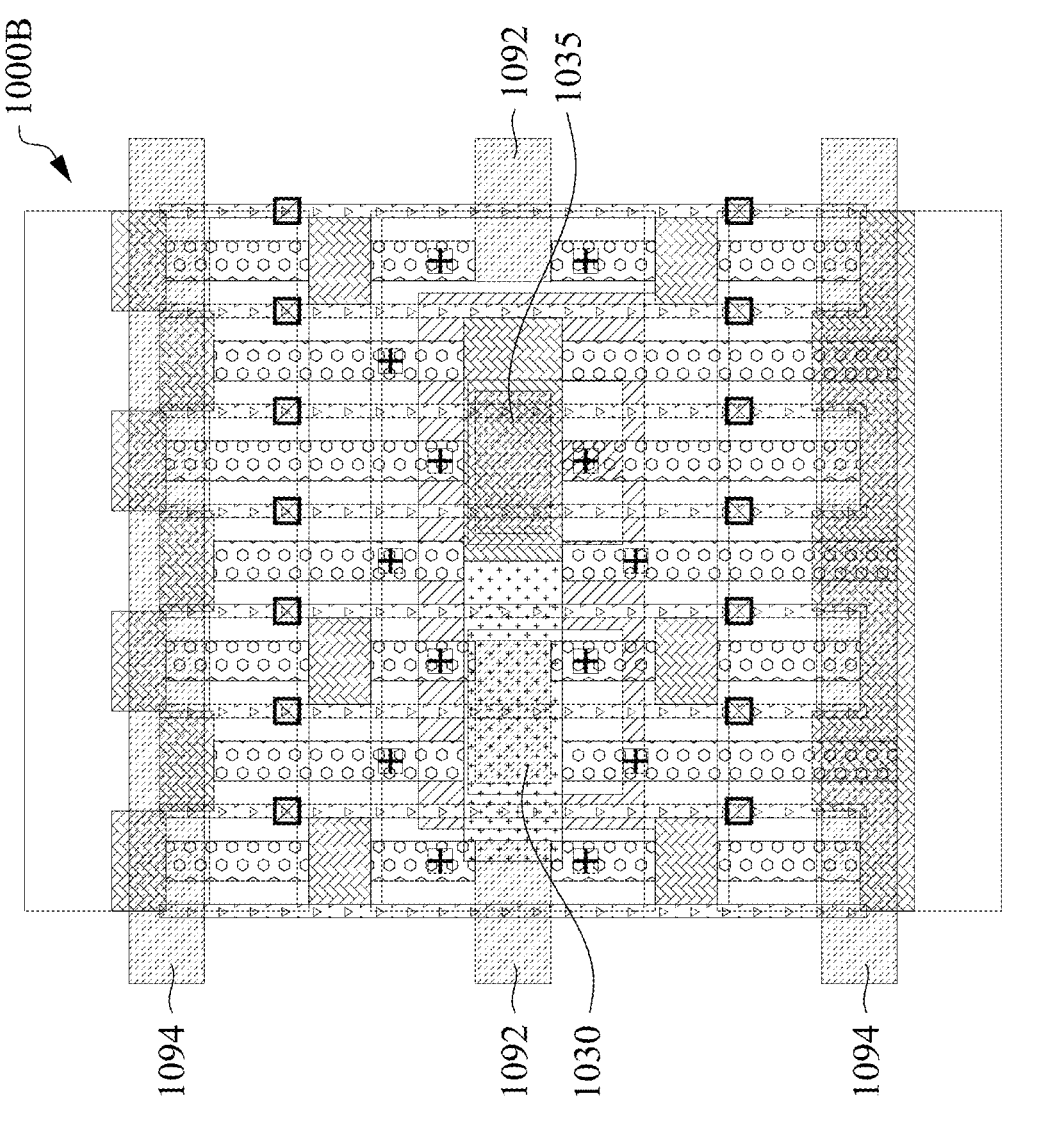
Fig. 10B

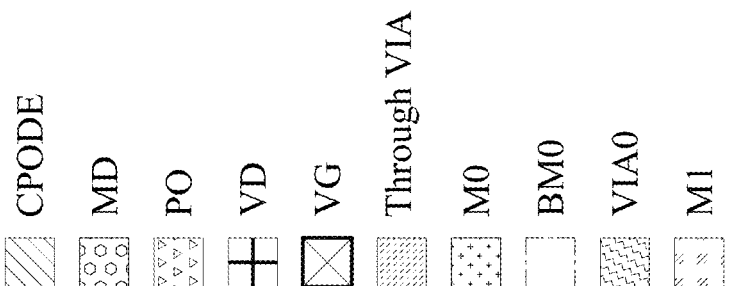
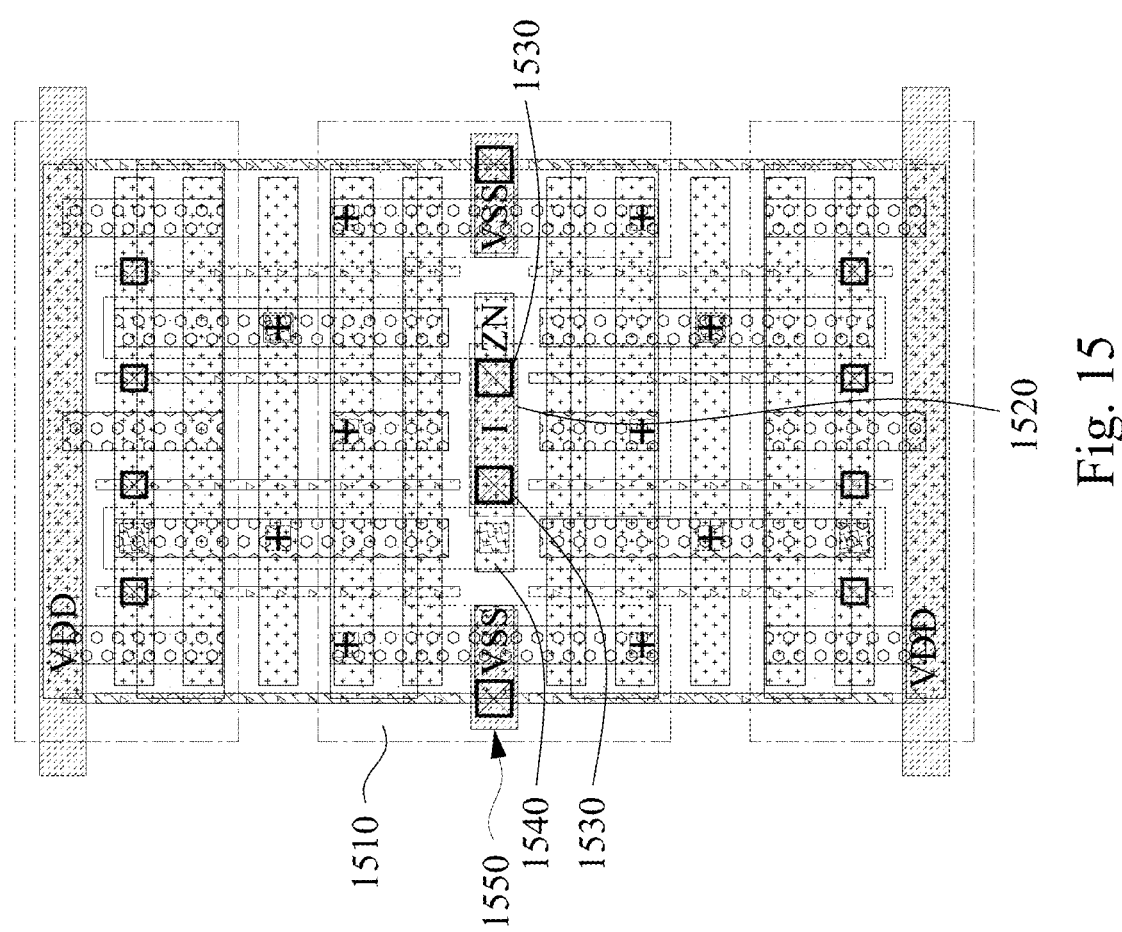
Fig. 15

CPODE

MD

PO

VD

VG

Through VIA

M0

BM0

VIA0

M1

1600

1630

1610

1650

1640

VSS

VSS

VDD

VDD

1620

1700

CPODE

MD

PO

VD

VG

Through VIA

M0

BM0

VIA0

M1

1800

1830

1820

1810

1850

1840

VDD

VSS

ZN

VSS

VDD

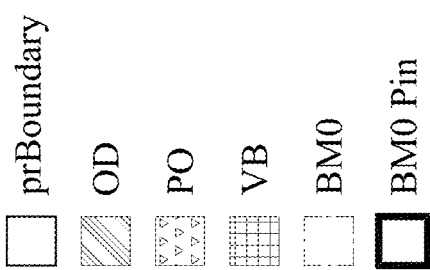
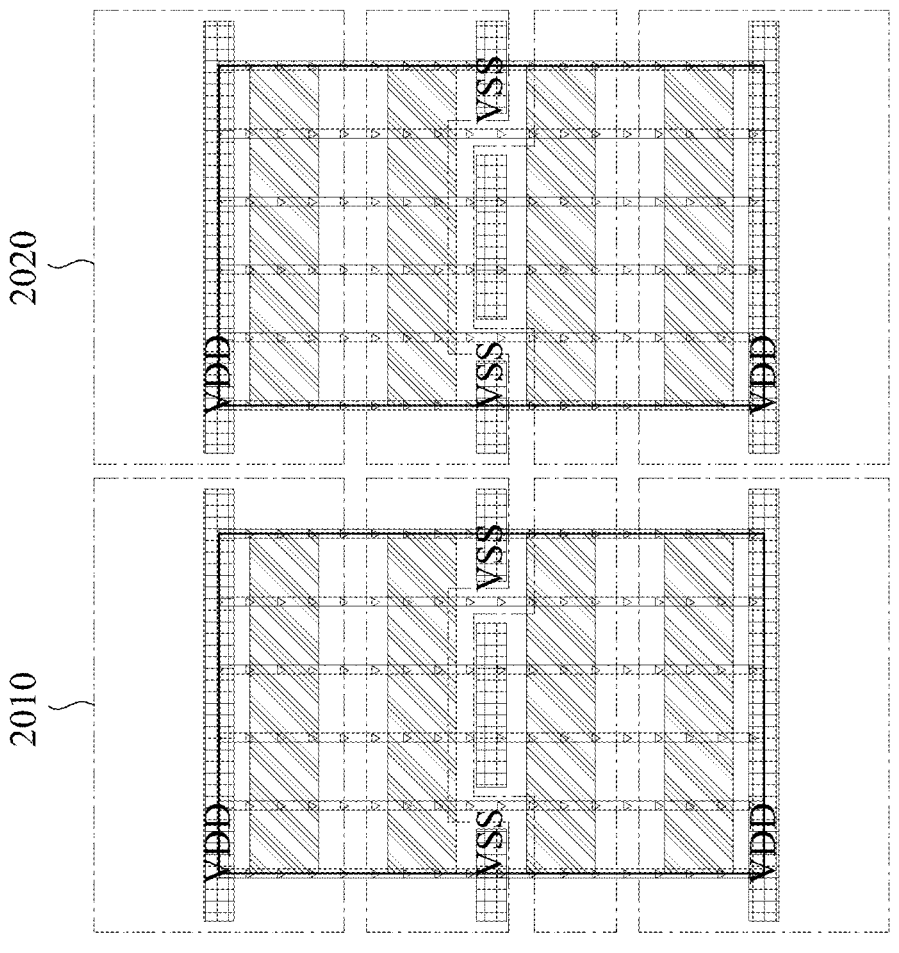
Fig. 20

SEMICONDUCTOR DEVICE INCLUDING THROUGH VIA AND METHOD OF MAKING

BACKGROUND

Inclusion of routing structures on a backside of a substrate from active devices, such as transistors, helps to improve routing efficiency of a semiconductor device and reduce overall size of the semiconductor device. The routing structures on the backside of the substrate are connected to components on the front side, i.e., a side including the active devices, using conductive vias extending through the substrate. In order to provide the electrical connection between the front side of the substrate and the backside of the substrate, the conductive via extending through the substrate is aligned with a component on the front side of the substrate. For example, in order to connect to a source/drain (S/D) region on the front side of the substrate, the conductive via is aligned with the S/D region. Based on this aligned connection, the S/D region is connected to the routing structure on the backside of the substrate through the conductive via.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a flowchart of a method of making a semiconductor device in accordance with some embodiments.

FIG. 6 is a view of a layout of a semiconductor device in accordance with some embodiments.

FIG. 8B is a view of a layout of a semiconductor device in accordance with some embodiments.

FIG. 9B is a view of a layout of a semiconductor device in accordance with some embodiments.

FIG. 10B is a view of a layout of a semiconductor device in accordance with some embodiments.

FIG. 15 is a view of a layout of a semiconductor device in accordance with some embodiments.

FIG. 20 is a view of cells of a semiconductor device in accordance with some embodiments.

DETAILED DESCRIPTION

Figure 1B:
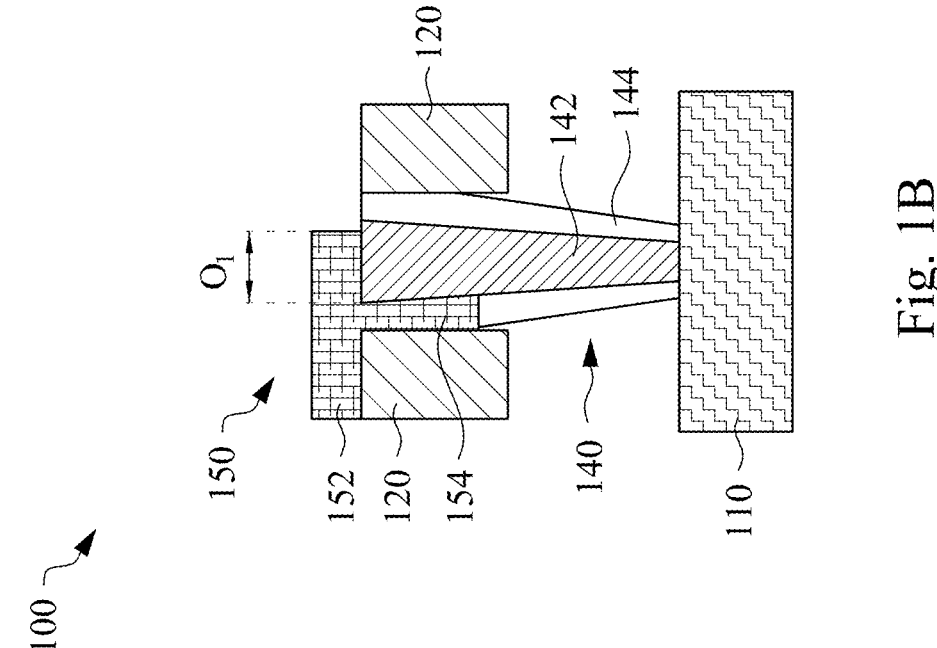
FIG. 1B is a cross-sectional view of a semiconductor device in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some approaches to routing structures, such as interconnects, for semiconductor devices, conductive meshes, such as power meshes or clock meshes, are used to route power or clock signals through the semiconductor device. These mesh structures occupy a significant portion of the routing structure and increase complexity for routing other types of signals, such as logic signals, through the semiconductor device. In some instances, the routing structure is increased in size to allow routing of the other types of signals around a periphery of the mesh structure. This routing strategy results in an increase in the size of the semiconductor device.

As pressure to decrease the size of semiconductor devices increases, advanced routing strategies are implemented for conveying signals from one portion of the semiconductor device to another. One advanced routing strategy is to utilize a backside of a substrate for routing purposes. The backside of the substrate is a side of the substrate opposite a side on which active devices, such as transistors are formed. Formation of routing structures, including a power mesh structure or a clock mesh structure, on the backside of the substrate helps to reduce an overall size of the semiconductor device by providing additional routing paths. The inclusion of additional routing paths helps to avoid increasing a size of the semiconductor device in order to be able to reliably manufacture the routing structure.

While the backside routing structures help to reduce overall semiconductor device size, alignment concerns exist for reliably connecting devices or routing structures on the front side of the substrate with the routing structure on the backside of the substrate. Conductive vias are used to electrically connect the backside routing structure to a device or front side routing structure. In some approaches, the via is aligned with the front side component in order to provide the electrical connection. However, this alignment increases manufacturing complexity and decreases production yield due to manufacturing deviation. That is, in situations where manufacturing deviations cause a misalignment between the conductive via and the front side component, the semiconductor device is non-operational.

The present disclosure helps to resolve the alignment concerns from other backside routing strategies by forming the conductive via that extends through the substrate, also called a through via, purposefully offset from the front side components. A contact structure on the front side of the substrate is extended in order to provide the electrical connection to the through via. In some embodiments, the routing strategy of the current disclosure is implemented using a clock mesh structure. In some embodiments, the routing strategy of the current disclosure is implemented using a power mesh structure. One of ordinary skill in the art would understand that that the current disclosure is not limited to these two mesh structures and that the features described in the current disclosure are applicable to other implementations including non-mesh structures.

Figure 1A:
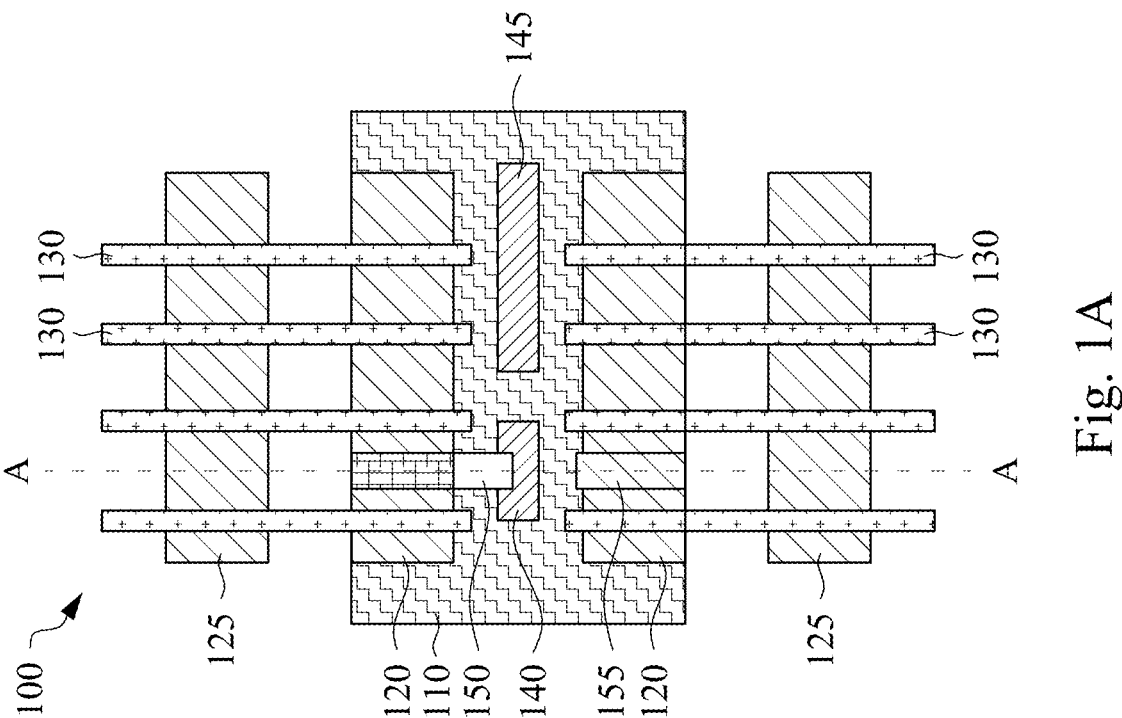
FIG. 1A is a top view of a semiconductor device in accordance with some embodiments.

FIG. 1A is a top view of a semiconductor device 100 in accordance with some embodiments. The semiconductor device 100 includes a backside routing structure 110. The backside routing structure 110 is on a first side of a substrate (not shown) of the semiconductor device 100. The semiconductor device 100 further includes a plurality of first active regions 120. Each of the first active regions 120 has a first dopant type. The semiconductor device 100 further includes a plurality of second active regions 125. Each of the second active regions 125 has a second dopant type opposite to the first dopant type. The plurality of first active regions 120 and the plurality of second active regions 125 are on a second side of the substrate of the semiconductor device 100 opposite to the backside routing structure 110. The backside routing structure 110 is covered by the first active regions 120 in the top view. The first active regions 120 and the second active regions 125 extend in a first direction parallel to a top of the substrate. The semiconductor device 100 further includes a plurality of gate structures 130. Each of the gate structures 130 extends in a second direction parallel to the top of the substrate and perpendicular to the first direction. Each of the gate structures 130 extends across one of the first active regions 120 and one of the second active regions 125. A space exists between adjacent first active regions 120. A first through via 140 extends from the backside routing structure 110 through the substrate to the second side of the substrate within the space between adjacent first active regions 120. A second through via 145 also extends from the backside routing structure 110 through the substrate to the second side of the substrate. The second through via 145 is spaced from the first through via 140 in the first direction. The semiconductor device 100 further includes an extended source/drain (S/D) contact 150. The extended S/D contact 150 extends from one of the first active regions 120 beyond a boundary of the first active region 120 and over the first through via 140. The extended S/D contact 150 electrically connects the first through via 140 to a S/D region on the first active region 120. The semiconductor device 100 further includes a S/D contact 155 over a S/D region of another of the first active regions 120. The S/D contact 155 does not extend over the first through via 140. Therefore, the S/D contact 155 is not directly electrically connected to the first through via 140.

The backside routing structure 110 is configured to convey electrical signals for the semiconductor device 100 on the first side of the substrate. The backside routing structure 110 include a plurality of conductive elements, such as conductive lines and conductive vias in order to convey the electrical signals. The conductive elements are surrounded by a dielectric material in order to provide electrical insulation between adjacent conductive elements and to reduce a risk of short circuits or cross-talk between the adjacent conductive elements. In some embodiments, the backside routing structure 110 includes a multi-layered structure. In some embodiments, the backside routing structure 110 includes a single layer structure. In some embodiments, the backside routing structure 110 includes a mesh structure, such as a power mesh structure or a clock mesh structure. In some embodiments, the conductive elements independently include copper, aluminum, tungsten, cobalt, alloys thereof, or other suitable conductive materials. In some embodiments, the dielectric material includes silicon oxide, silicon nitride, silicon oxynitride, or another suitable dielectric material. In some embodiments, the backside routing structure 110 is formed by a series of etching and deposition processes. In some embodiments, the backside routing structure 110 is formed using a damascene process, such as a dual damascene process.

The plurality of first active regions 120 include regions of a semiconductor material containing a dopant of a first type. In some embodiments, the first type is a p-type dopant. In some embodiments, the first type is an n-type dopant. In some embodiments, the first active regions 120 are at least partially embedded in the substrate. In some embodiments, the first active regions 120 are formed in an epitaxial layer formed over the substrate. In some embodiments, the first active regions 120 define planar structures, e.g., for a metal-oxide-semiconductor (MOS) type structure. In some embodiments, the first active regions 120 define fin structures, e.g., for fin field effect transistor (FinFET) type structures. In some embodiments, the first active regions 120 define nanowire type structures, e.g., for gate all around (GAA) transistor type structures. In some embodiments, the first active regions 120 are formed by ion implantation processes. In some embodiments, the first active regions 120 are formed by an in-situ doping process, such as during an epitaxial process. In some embodiments, a shape of the first active regions 120 is formed by one or more etching processes.

The semiconductor device 100 includes two first active regions 120. One of ordinary skill in the art would understand that more than two first active regions 120 is within the scope of this disclosure. The two first active regions 120 are adjacent to one another. An outer boundary of the backside routing structures 110 is aligned, in the top view, with an outer boundary of the two first active regions 120 in the first direction. In some embodiments, the backside routing structure 110 is not aligned with the outer boundary of the two first active regions 120. The two first active regions 120 are separated from one another in the second direction.

The plurality of second active regions 125 are similar to the plurality of first active regions 120 except that the plurality of second active regions 125 have an opposite dopant type from the plurality of first active regions 120. Detailed description of the plurality of second active regions 125 is omitted for the sake of brevity. The semiconductor device 100 includes two second active regions 125. One of ordinary skill in the art would understand that an embodiment having more than two second active regions 125 is within the scope of this disclosure. The two second active regions 125 are separated from one another in the second direction by the first active region 120. The second active regions 125 do not overlap the backside routing structure 110 in the top view. In some embodiments, at least one of the second active regions 125 overlaps the backside routing structure 110 in the top view.

The plurality of gate structures 130 are usable to form transistors for selectively connecting S/D regions of the first active regions 120 together or S/D regions of the second active regions 125 together. In some embodiments, the plurality of gate structures 130 define fingers of a same transistor structure. In some embodiments, the plurality of gate structures 130 define more than one transistor structure. In some embodiments, the plurality of gate structures 130 include a gate dielectric adjacent to a corresponding first active region 120 or second active region 125; and a gate electrode over the gate dielectric. In some embodiments, the gate dielectric includes a high-k dielectric material. A high-k dielectric material has a dielectric constant greater than a dielectric constant of silicon oxide. In some embodiments, the gate electrode includes copper, aluminum, tungsten, cobalt, alloys thereof, or another suitable conductive material.

The first through via 140 is configured to electrically connect the backside routing structure 110 to the extended S/D contact 150. The first through via 140 extends from the first side of the substrate to the second side of the substrate. The first through via 140 is offset from each of the first active regions 120 and each of the second active regions 125 in the top view. The first through via 140 is between adjacent first active regions 120. The first through via 140 includes a conductive material. In some embodiments, the conductive material includes copper, aluminum, tungsten, cobalt, or another suitable conductive material. In some embodiments, the through via 140 includes a protection layer between the conductive material and the substrate. The protection layer includes a dielectric material. The semiconductor device 100 includes the first through via 140 between adjacent first active regions 120, which have a same dopant type. In some embodiments, the first through via 140 is between a first active region 120 and a second active region 125 that has a different dopant type from the first active region 120.

The second through via 145 extends through the substrate and is electrically connected to the backside routing structure 110. A structure of the second through via 145 is similar to the structure of the first through via 140, and a detailed description is omitted for the sake of brevity. In some embodiments, the second through via 145 has a different size from the first through via 140. The first through via 140 is spaced from the second through via 145 in the first direction. In some embodiments, the first through via 140 is electrically connected to the second through via 145 by the backside routing structure 110. In some embodiments, the first through via 140 is electrically separated from the second through via 145.

The extended S/D contact 150 is configured to electrically connect the first through via 140 and a S/D region of the first active region 120. The extended S/D contact 150 extends over a portion of the first through via 140. In some embodiments, the extended S/D contact 150 includes a portion extending along a sidewall of the conductive material of the first through via 140. The portion of the extended S/D contact 150 extending along the sidewall of the conductive material of the first through via 140 helps to decrease resistance of the electrical connection between the first through via 140 and the extended S/D contact 150. In some embodiments, the extended S/D contact 150 is electrically connected to the S/D region of the first active region 120 through a silicide layer. In some embodiments, the extended S/D contact 150 includes copper, aluminum, tungsten, cobalt, alloys thereof, or other suitable conductive materials.

The S/D contact 155 is electrically connected to a different first active region 120 from the extended S/D contact 150. A structure of the S/D contact 155 is similar to the structure of the extended S/D contact 150 except that the S/D contact 155 is not directly electrically connected to the first through via 140. A structure of the S/D contact 155 is not described in detail for the sake of brevity.

The semiconductor device 100 is able to simplify manufacturing processes and improve production yield in comparison with approaches that rely on alignment between through vias and components on the second side of the substrate. By utilizing the extended S/D contact 150, the semiconductor device 100 is able to be manufactured with a higher deviation tolerance with respect to other approaches.

FIG. 1B is a cross-sectional view of the semiconductor device 100 in accordance with some embodiments. FIG. 1B is a view of the semiconductor device 100 taken along line A-A of FIG. 1A. In comparison with FIG. 1A, FIG. 1B includes more detail related to the first through via 140 and the extended S/D contact 150.

The first through via 140 includes a conductive material 142 and a protective liner 144. A material of the conductive material 142 is discussed above with respect to FIG. 1A. The protective liner 144 separates the conductive material 142 from surrounding elements, such as a substrate or first active regions 120. The protective liner 144 extends along an entire sidewall of the conductive material on a side of the conductive material farthest from the extended S/D contact 150. The protective liner 144 extends over less than an entirety of the sidewall of the conductive material 142 closest to the extended S/D contact 150. In some embodiments, the protective liner 144 exposes about 10% to about 25% of the sidewall of the conductive material 142 closest to the extended S/D contact 150. If the amount of exposed sidewall of the conductive material 142 is too small, a resistance between the extended S/D contact 150 and the conductive material 142 is increased, which delays signal propagation in some instances. If the amount of exposed sidewall of the conductive material 142 is too great, a risk of unintentional electrical connection between the conductive material 142 and other components of the semiconductor device 100 increases, in some instances. In some embodiments, the protective liner 144 includes silicon oxide, silicon nitride, silicon carbide, silicon oxycarbide, silicon oxynitride, or another suitable dielectric material.

The extended S/D contact 150 includes a first portion 152, extending along a top surface of the first through via 140, and a second portion 154, extending along a sidewall of the conductive material 142 of the first through via 140. A material of the extended S/D contact 150 is described above with respect to FIG. 1A. A bottommost surface of the second portion 154 contacts the protective liner 144. In some embodiments, the bottommost surface of the second portion 154 is separate from the protective liner 144 with a gap between the two materials. The first portion 152 extends across a top-most surface of the first through via 140. The first portion 152 extends for overlap distance $O_1$ across the first through via 140. In some embodiments, the overlap distance $O_1$ ranges from about 50% to about 80% of a width of the top surface of the first through via 140. If the overlap distance $O_1$ is too small, then a resistance between the extended S/D contact 150 and the first through via 140 increases, which slows signal propagation in some instances. If the overlap distance $O_1$ is too great, a risk of the extended S/D contact 150 unintentionally electrically connecting to another component of the semiconductor device 100 increases, in some instances.

Figure 2B:
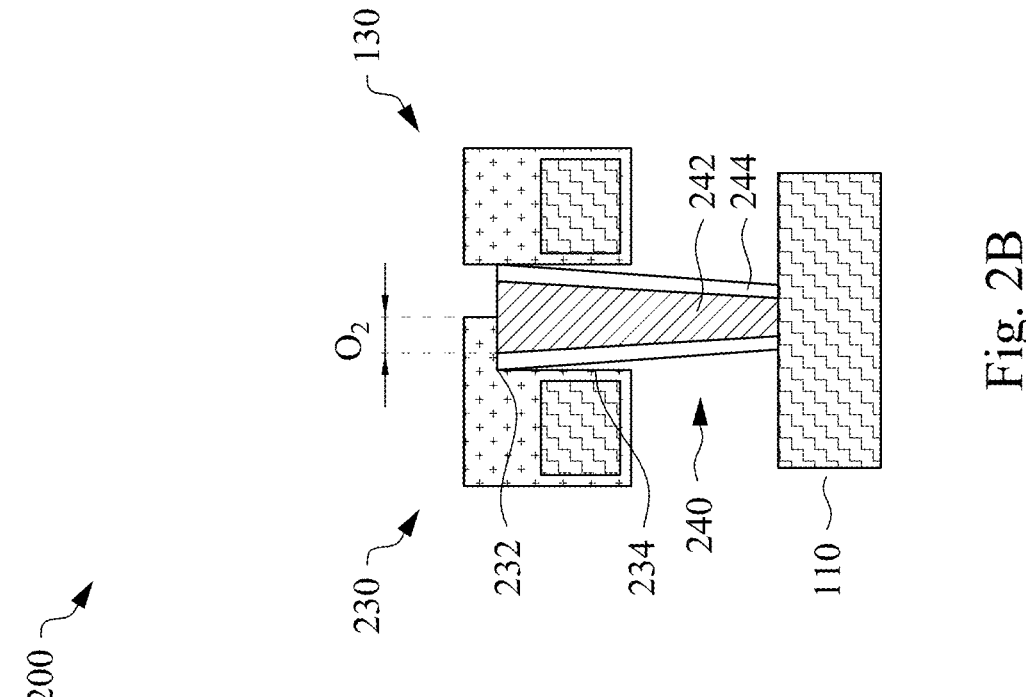
FIG. 2B is a cross-sectional view of a semiconductor device in accordance with some embodiments.
Figure 2A:
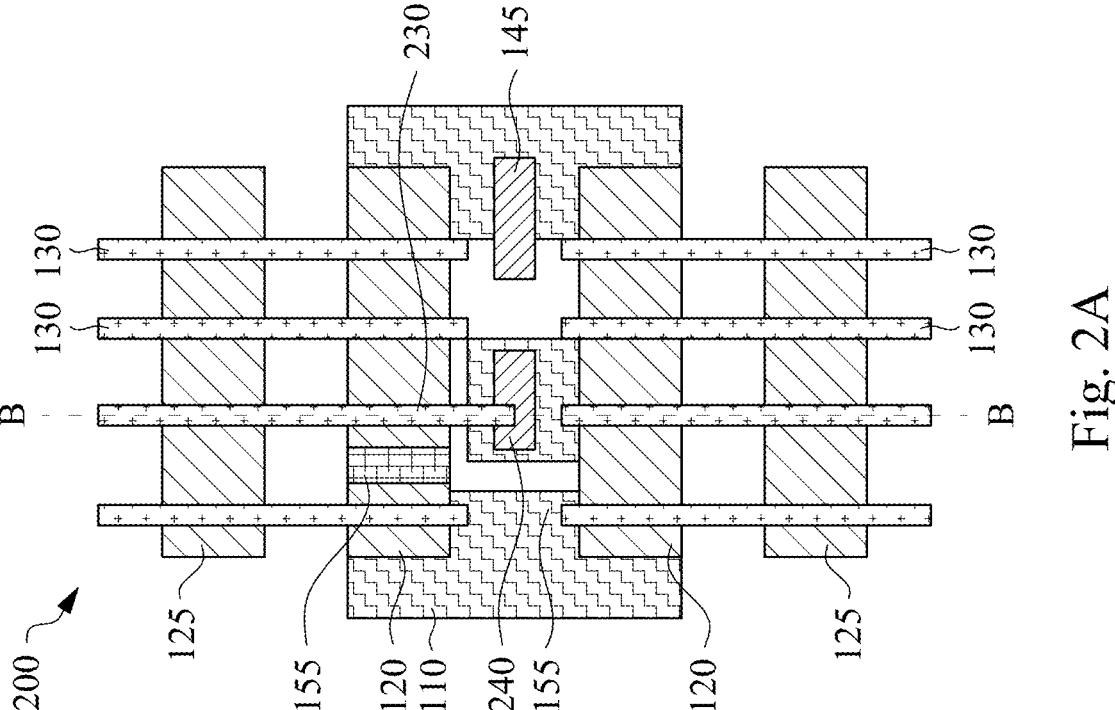
FIG. 2A is a top view of a semiconductor device in accordance with some embodiments.

FIG. 2A is a top view of a semiconductor device 200 in accordance with some embodiments. The semiconductor device 200 is similar to the semiconductor device 100 (FIG. 1A). Similar components in the semiconductor device 100 (FIG. 1A) have a same reference number in the semiconductor device 200. In comparison with the semiconductor device 100 (FIG. 1A), the semiconductor device 200 does not include an extended S/D contact. Instead, the semiconductor device 200 includes an extended gate contact 230 electrically connected to a first through via 240. The first through via 240 has a similar structure at the first through via 140 (FIG. 1A), so detailed description of the first through via 240 is omitted for the sake of brevity.

The extended gate contact 230 is configured to electrically connect the first through via 240 and a gate over the first active region 120. The extended gate contact 230 extends over a portion of the first through via 240. In some embodiments, the extended gate contact 230 includes a portion extending along a sidewall of the conductive material of the first through via 240. The portion of the extended gate contact 230 extending along the sidewall of the conductive material of the first through via 240 helps to decrease resistance of the electrical connection between the first through via 240 and the extended gate contact 230. In some embodiments, the extended gate contact 230 is electrically connected to the gate over the first active region 120 through a silicide layer. In some embodiments, the extended gate contact 230 includes copper, aluminum, tungsten, cobalt, alloys thereof, or other suitable conductive materials.

FIG. 2B is a cross-sectional view of the semiconductor device 200 in accordance with some embodiments. FIG. 2B is a view of the semiconductor device 200 taken along line B-B of FIG. 2A. In comparison with FIG. 2A, FIG. 2B includes more detail related to the first through via 240 and the extended gate contact 230.

The first through via 240 includes a conductive material 242 and a protective liner 244. A material of the conductive material 242 is similar to a material of conductive material 142 (FIG. 1B). The protective liner 244 separates the conductive material 242 from surrounding elements, such as a substrate or gate structures 130. The protective liner 244 extends along an entire sidewall of the conductive material 242 on both sides of the conductive material 242. In some embodiments, the protective liner 244 includes silicon oxide, silicon nitride, silicon carbide, silicon oxycarbide, silicon oxynitride, or another suitable dielectric material.

The extended gate contact 230 includes a first portion 232, extending along a top surface of the first through via 240, and a second portion 234, extending along a sidewall of the first through via 240. In some embodiments, a material of the extended gate contact 230 includes copper, aluminum, tungsten, cobalt, alloys thereof, or another suitable conductive material. The second portion 234 is separated from the conductive material 242 by the protective liner 244. The first portion 232 extends across a top-most surface of the first through via 240. The first portion 232 extends for overlap distance $O_2$ across the first through via 240. In some embodiments, the overlap distance $O_2$ ranges from about 50% to about 80% of a width of the top surface of the first through via 240. If the overlap distance $O_2$ is too small, then a resistance between the extended gate contact 230 and the first through via 240 increases, which slows signal propagation in some instances. If the overlap distance $O_2$ is too great, a risk of the extended gate contact 230 unintentionally electrically connecting to another component of the semiconductor device 200 increases, in some instances.

FIG. 3 is a flowchart of a method 300 of making a semiconductor device in accordance with some embodiments. In some embodiments, the method 300 is usable to make the semiconductor device 100 (FIG. 1A). In some embodiments, the method 300 is usable to make the semiconductor device 200 (FIG. 2A). In some embodiments, the method 300 is usable to make a semiconductor device different from the semiconductor device 100 or the semiconductor device 200.

In operation 305, active regions are defined. In some embodiments, the active regions are defined by implanting a dopant into a substrate. In some embodiments, the active regions are defined by etching a substrate to define one or more openings and epitaxially growing a doped material in the one or more openings. In some embodiments, the substrate is etched to form the active regions as fin structures, such as for FinFET devices. In some embodiments, the substrate is etched to form the active regions as nanowires, such as for GAA devices.

Figure 4A:
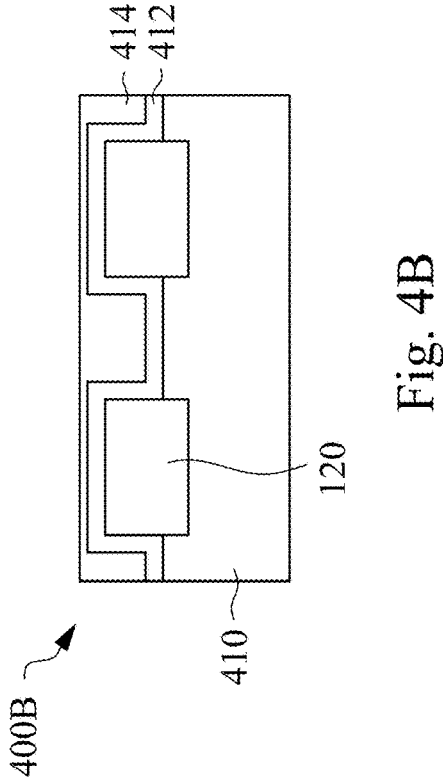
FIGS. 4A-4J are cross-sectional views of a semiconductor device at intermediate stages of manufacture in accordance with some embodiments.

FIGS. 4A-4J are cross-sectional views of a semiconductor device at intermediate stages of manufacture in accordance with some embodiments. The semiconductor device of FIGS. 4A-4J is not an entirety of the semiconductor device and the portion of the semiconductor device in FIGS. 4A-4J is used to depict changes in the structure during the manufacturing process. FIG. 4A is a cross-sectional view of a semiconductor device 400A following definition of active regions. In some embodiments, the semiconductor device 400A is formed by the operation 305 of the method 300 (FIG. 3). In some embodiments, the semiconductor device 400A is formed using a process different from the operation 305. The semiconductor device 400A includes a substrate 410 and a plurality of first active regions 120. Each of the plurality of first active regions 120 protrudes from a top surface of the substrate 410 and extends into the substrate 410. In some embodiments, an entirety of each of the first active regions 120 is above the top surface of the substrate 410. In some embodiments, a top surface of each of the plurality of first active regions 120 is co-planar with the top surface of the substrate 410.

Returning to FIG. 3, in operation 310 a dielectric material is formed and a hardmask is deposited on the active regions. In operation 310, the hardmask is deposited prior to the formation of the dielectric material. In some embodiments, the hardmask is also able to function as an etch stop layer (ESL) between the dielectric material and either the active regions or the substrate. In some embodiments, the hardmask is deposited using chemical vapor deposition (CVD), physical vapor deposition (PVD), atomic layer deposition (ALD), high density plasma CVD (HDPCVD), or another suitable deposition process. In some embodiments, the hardmask includes silicon oxide, silicon nitride, or another suitable material. A thickness of the hardmask layer is sufficient to protect the underlying active regions and substrate during subsequent processing during the manufacturing of the semiconductor device. The dielectric material provides electrical isolation between adjacent active regions. In some embodiments, the dielectric material is different from the hardmask material. In some embodiments, the dielectric material is a same material as the hardmask material. In some embodiments, the dielectric material includes silicon oxide, silicon nitride, silicon oxynitride, or another suitable dielectric material. In some embodiments, the dielectric material is deposited using PVD, CVD, ALD, HDPCVD, or another suitable deposition process. In some embodiments, the dielectric material is deposited using a same process as the hardmask material. In some embodiments, the dielectric material is deposited using a different process from the hardmask. In some embodiments, a planarization or chemical mechanical planarization (CMP) process is performed on the dielectric material following deposition to flatten a top surface of the dielectric material. In some embodiments, the flattened top surface of the dielectric material is above a top surface of the hardmask. In some embodiments, the flattened top surface of the dielectric material is co-planar with the top surface of the hardmask. In some embodiments, the dielectric material is able to function as a shallow trench isolation (STI) structure between adjacent active regions.

Figure 4B:
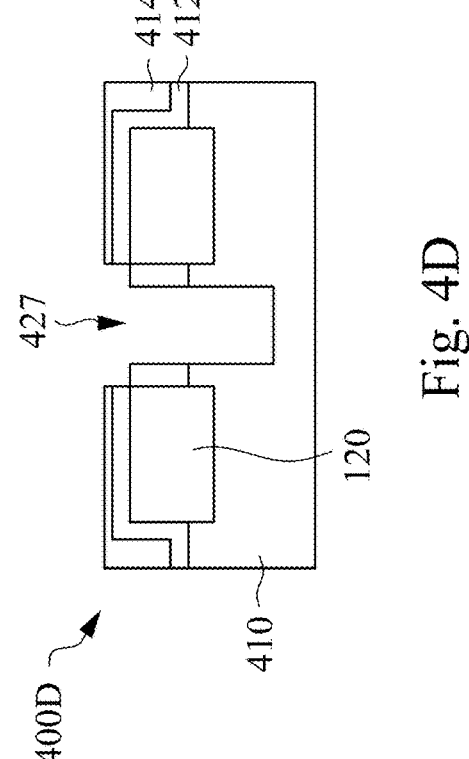

FIG. 4B is a cross-sectional view of a semiconductor device 400B in accordance with some embodiments. In some embodiments, the semiconductor device 400B is formed by the operation 310 of the method 300 (FIG. 3). In some embodiments, the semiconductor device 400B is formed using a process different from the operation 310. The semiconductor device 400B is similar to the semiconductor device 400A (FIG. 4A); and similar elements have the same reference number. In comparison with the semiconductor device 400A (FIG. 4A), the semiconductor device 400B includes a hardmask layer 412 over the substrate 410 and the plurality of first active regions 120. The semiconductor device 400B further includes a dielectric material 414 over the hardmask layer 412 and between adjacent first active regions 120.

Returning to FIG. 3, in operation 315, the hardmask is patterned to define a through via location. The hardmask is patterned to remove a portion of the hardmask between adjacent active regions. The removal of the portion of the hardmask exposes a portion of the substrate. In some embodiments, patterning of the hardmask includes a series of photolithography and etching processes to remove the portion of the hardmask. In some embodiments, a photomask is used to define the location of the through via. The photomask is used to pattern and develop a layer of photoresist that was deposited over the dielectric material.

Figure 4C:
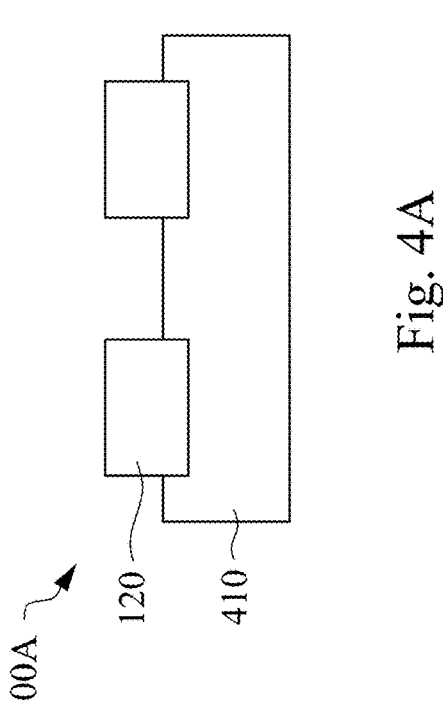

FIG. 4C is a cross-sectional view of a semiconductor device 400C in accordance with some embodiments. In some embodiments, the semiconductor device 400C is formed by the operation 315 of the method 300 (FIG. 3). In some embodiments, the semiconductor device 400C is formed using a process different from the operation 315. The semiconductor device 400C is similar to the semiconductor device 400B (FIG. 4B); and similar elements have the same reference number. In comparison with the semiconductor device 400B (FIG. 4B), the semiconductor device 400C includes an opening 425 extending through the dielectric material 414 and the hardmask layer 412 to expose a portion of the substrate 410. A photomask 420 is positioned above the dielectric material 414 and is usable to define the location where the opening 425 is formed.

Returning to FIG. 3, in operation 320 the substrate is etched to define a through via opening. The opening defined in the hardmask layer is used as a mask to etch the substrate. The etching process defines an opening extending through less than an entirety of the substrate in the thickness direction. The hardmask protects the active regions during the etching process. In some embodiments, the etching includes a wet etching process. In some embodiments, the etching includes a dry etching process.

Figure 4D:
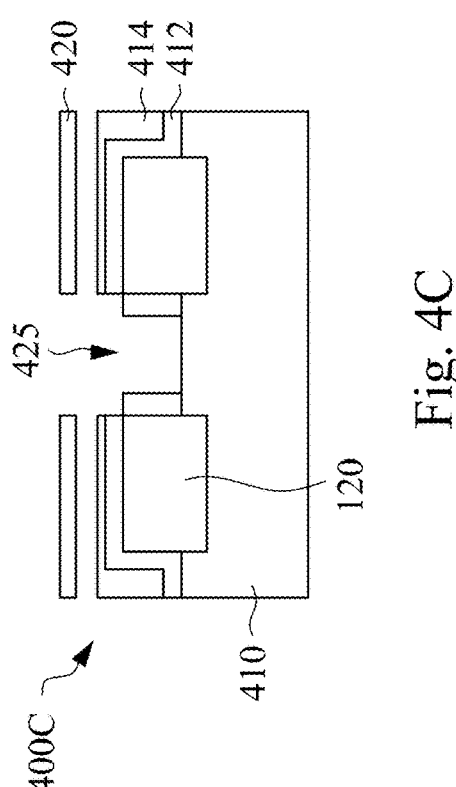

FIG. 4D is a cross-sectional view of a semiconductor device 400D in accordance with some embodiments. In some embodiments, the semiconductor device 400D is formed by the operation 320 of the method 300 (FIG. 3). In some embodiments, the semiconductor device 400D is formed using a process different from the operation 320. The semiconductor device 400D is similar to the semiconductor device 400C (FIG. 4C); and similar elements have the same reference number. In comparison with the semiconductor device 400C (FIG. 4C), the semiconductor device 400D includes an opening 427 extending into the substrate 410. A location of the opening 427 corresponds to the location of the opening 425 (FIG. 4C). The hardmask layer 412 protects the plurality of active regions 120 during the etching process to define the opening 427.

Returning to FIG. 3, in optional operation 325, a protection layer is deposited in the through via opening. The protection layer provides additional protection for the substrate and active regions during subsequent processing of the semiconductor device. The protection layer includes a dielectric material. In some embodiments, the protection layer is deposited using CVD, PVD, ALD, HDPCVD, or another suitable deposition process. In some embodiments, protection layer is deposited in the through via opening as well as over the dielectric material formed in operation 310. In some embodiments, the operation 325 is omitted. For example, in some embodiments where a thickness of the hardmask is sufficient to protect the sidewalls of the active regions during subsequent process, the protection layer is superfluous and the operation 325 is omitted.

Figure 4E:
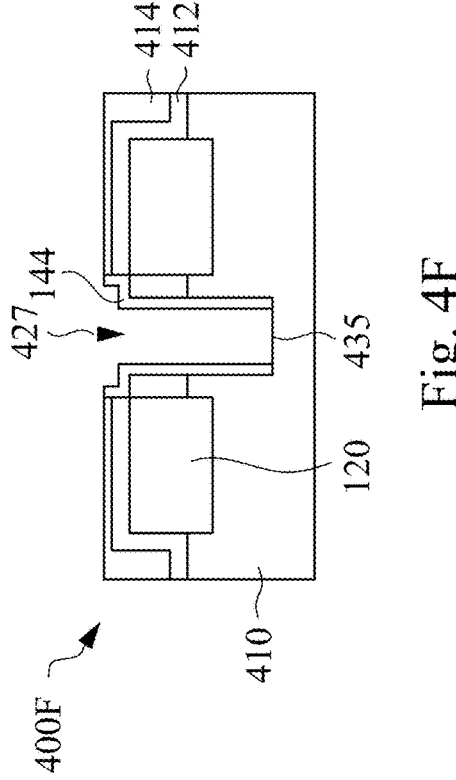

FIG. 4E is a cross-sectional view of a semiconductor device 400E in accordance with some embodiments. In some embodiments, the semiconductor device 400E is formed by the operation 325 of the method 300 (FIG. 3). In some embodiments, the semiconductor device 400E is formed using a process different from the operation 325. The semiconductor device 400E is similar to the semiconductor device 400D (FIG. 4D); and similar elements have the same reference number. In comparison with the semiconductor device 400D (FIG. 4D), the semiconductor device 400E includes a protection layer 430 in the opening 427. The protection layer 430 is also over the dielectric material 414. The protection layer 430 covers the bottom and sidewalls of the opening 427. In some embodiments, a material of the protection layer 430 is similar to the protection layer 144 (FIG. 1B).

Returning to FIG. 3, in optional operation 330, a portion of the protection layer is removed. The portion of the protection layer is removed using an etching process to exposes the substrate at a bottom of the through via opening. In some embodiments, the etching includes a wet etching process. In some embodiments, the etching includes a dry etching process. In some embodiments, the operation 330 is omitted. In some embodiments, the operation 330 is omitted because the operation 325 is omitted. In some embodiments, even if the operation 325 is performed, the operation 330 is still omitted. For example, in some embodiments, where a backside of the substrate is removed to an extend to remove the portion of the protection layer along with the substrate removal, the operation 330 is omitted even if the operation 325 is performed.

Figure 4F:
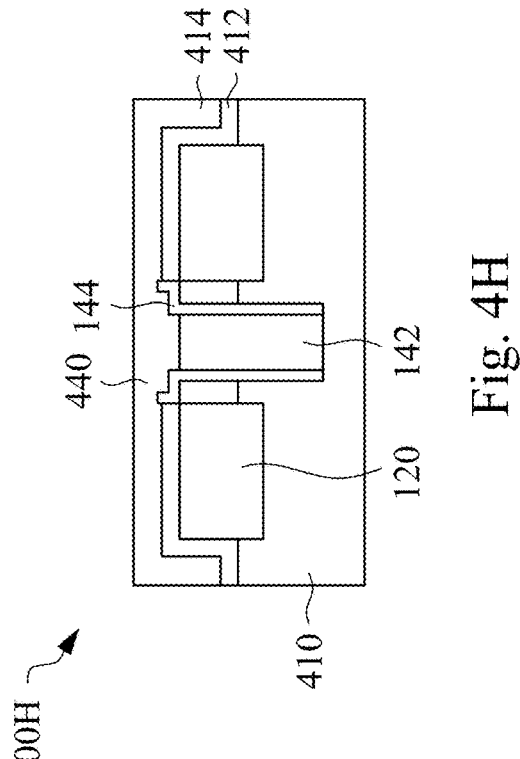

FIG. 4F is a cross-sectional view of a semiconductor device 400F in accordance with some embodiments. In some embodiments, the semiconductor device 400F is formed by the operation 330 of the method 300 (FIG. 3). In some embodiments, the semiconductor device 400F is formed using a process different from the operation 330. The semiconductor device 400F is similar to the semiconductor device 400E (FIG. 4E); and similar elements have the same reference number. In comparison with the semiconductor device 400E (FIG. 4E), the semiconductor device 400F includes the protection layer 144 exposing the substrate 410 at a bottom surface 435 of the opening 427. The protection layer 430 from FIG. 4E is renumbered as the protection layer 144 in FIG. 4F to indicate that the protection layer 144 is similar to the protection layer 144 (FIG. 1B) because the material of the protection layer was removed from above the dielectric material 414.

Returning to FIG. 3, in operation 335, a conductive material is formed in the through via opening. The conductive material is usable to provide an electrical path from a side of the substrate including the active regions to an opposite side of the substrate. In some embodiments, the conductive material includes copper, aluminum, tungsten, cobalt, alloys thereof, or other suitable conductive material. In some embodiments, the conductive material is formed using PVD, plating, or another suitable process. The conductive material fills a portion of the through via opening not occupied by the protective layer. In some embodiments that do not include the protective layer, the conductive material fills an entirety of the through via opening. In some embodiments, the conductive material is formed over the dielectric material formed in operation 310.

In operation 340, the conductive material is recessed on the front side of the substrate. The recessing removes the conductive material outside of the through via opening, such as the conductive material above the dielectric material. In some embodiments, the conductive material is removed using an etching process. In some embodiments, the conductive material is removed using a combination of an etching process and a planarization process. In some embodiments, the etching process includes a wet etching process. In some embodiments, the etching process includes a dry etching process.

Figure 4G:
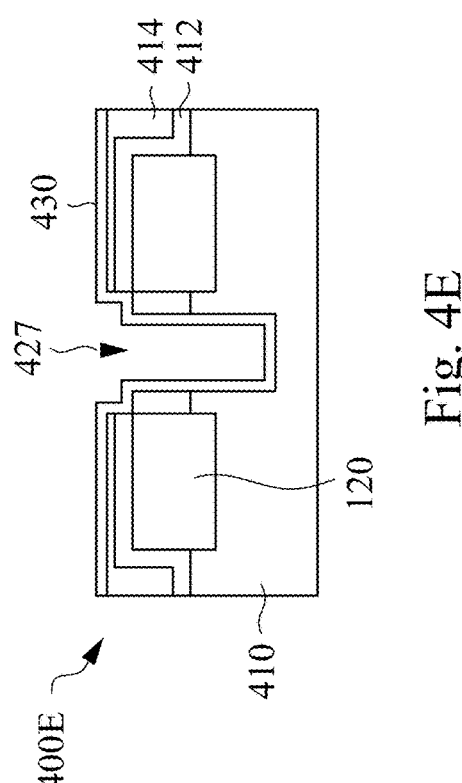

FIG. 4G is a cross-sectional view of a semiconductor device 400G in accordance with some embodiments. In some embodiments, the semiconductor device 400G is formed by the operation 340 of the method 300 (FIG. 3). In some embodiments, the semiconductor device 400G is formed using a process different from the operation 340. The semiconductor device 400G is similar to the semiconductor device 400F (FIG. 4F); and similar elements have the same reference number. In comparison with the semiconductor device 400F (FIG. 4F), the semiconductor device 400G includes the conductive material 142 in the through via opening. The bottom surface of the conductive material 142 directly contacts the substrate 410. In some embodiments, the protection layer 144 is between the bottom surface of the conductive material 142 and the substrate 410.

Returning to FIG. 3, in operation 345, a dielectric material is formed over the through via. In some embodiments, the dielectric material is usable as an ILD layer. In some embodiments, the dielectric material formed in the operation 345 is a same material as the dielectric material formed in the operation 310. In some embodiments, the dielectric material formed in the operation 345 is a different material from the dielectric material formed in the operation 310. In some embodiments, the dielectric material includes silicon oxide, silicon nitride, silicon oxynitride, or another suitable dielectric material. In some embodiments, the dielectric material is deposited using PVD, CVD, ALD, HDPCVD, or another suitable deposition process. In some embodiments, a planarization or CMP process is performed on the dielectric material following deposition to flatten a top surface of the dielectric material.

Figure 4H:
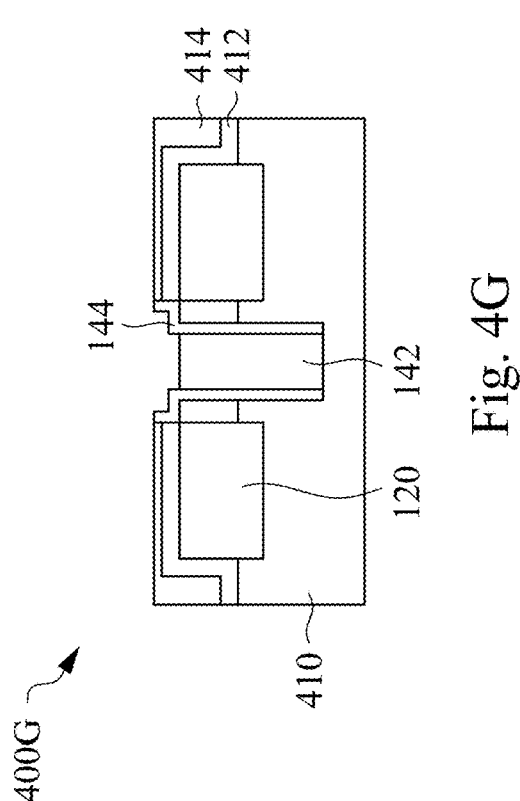

FIG. 4H is a cross-sectional view of a semiconductor device 400H in accordance with some embodiments. In some embodiments, the semiconductor device 400H is formed by the operation 345 of the method 300 (FIG. 3). In some embodiments, the semiconductor device 400H is formed using a process different from the operation 345. The semiconductor device 400H is similar to the semiconductor device 400G (FIG. 4G); and similar elements have the same reference number. In comparison with the semiconductor device 400G (FIG. 4G), the semiconductor device 400H includes the dielectric layer 440 over the dielectric material 414 and the through via including the protection layer 144 and conductive material 142. In some embodiments, an interface exists at a junction of dielectric layer 440 and the dielectric material 414. In some embodiments, no interface exists at the junction of the dielectric layer 440 and the dielectric material 414.

Returning to FIG. 3, in operation 350, the dielectric material is patterned to expose a portion of the conductive material. The dielectric material is patterned to remove a portion of the dielectric material over a top surface of the conductive material. In some embodiments, the operation 350 further includes removal of a portion of the protection layer to partially expose a sidewall of the conductive material. In some embodiments, patterning of the dielectric material includes a series of photolithography and etching processes to remove the portion of the dielectric material. In some embodiments, a photomask is used to define the portion of the dielectric material to be removed. The photomask is used to pattern and develop a layer of photoresist that was deposited over the dielectric material.

Figure 4J:
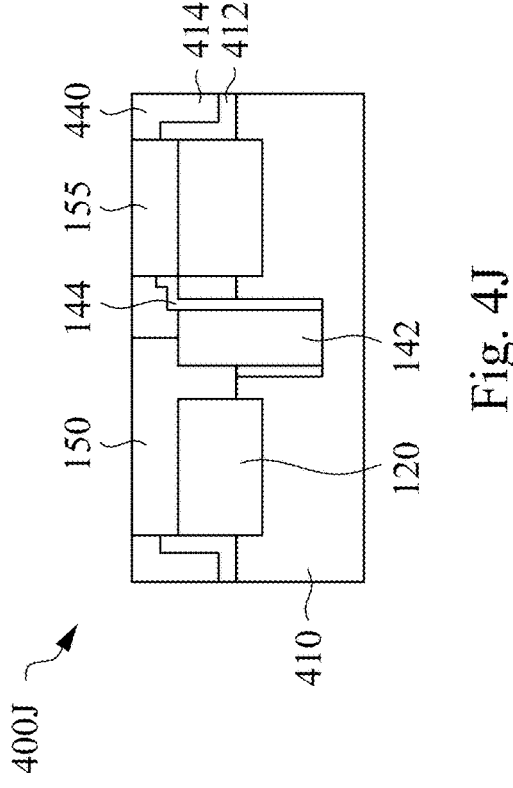
Figure 4I:
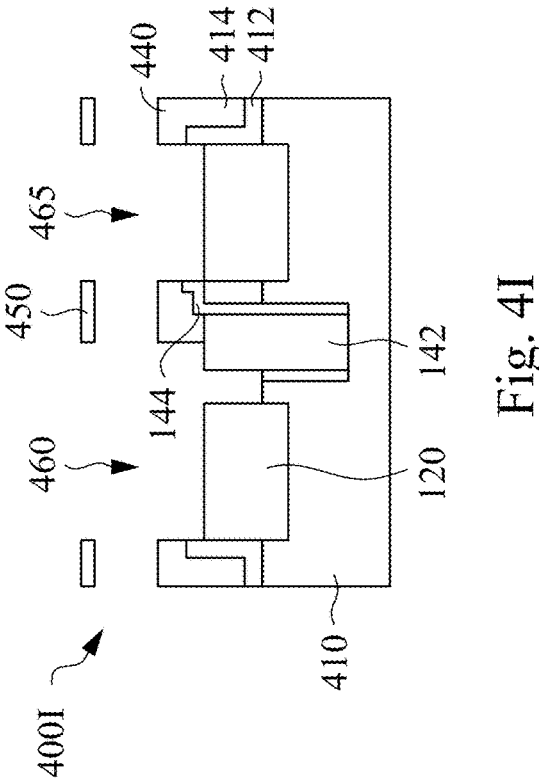

FIG. 4I is a cross-sectional view of a semiconductor device 400I in accordance with some embodiments. In some embodiments, the semiconductor device 400I is formed by the operation 350 of the method 300 (FIG. 3). In some embodiments, the semiconductor device 400I is formed using a process different from the operation 350. The semiconductor device 400I is similar to the semiconductor device 400H (FIG. 4H); and similar elements have the same reference number. In comparison with the semiconductor device 400H (FIG. 4H), the semiconductor device 400I includes an opening 460 in the dielectric layer 440. The opening 460 exposes a portion of the top surface of the conductive material 142. In some embodiments, a portion of the conductive material 142 is similar to the portion covered by the extended S/D contact 150 (FIG. 1B); or the portion covered by the extended gate structure 230 (FIG. 2B). The opening 460 also exposes a portion of the sidewall of the conductive material 142. In some embodiments, the opening 460 does not expose any of the sidewall of the conductive material 142. An opening 465 in the dielectric layer 440 does not extend over the conductive material 142. A remaining portion of the dielectric layer 440 between opening 460 and opening 465 provides electrical isolation between conductive materials formed in the two openings in subsequent processing. A photomask 450 is positioned over the dielectric layer 440 to define the locations of the opening 460 and the opening 465.

Returning to FIG. 3, in operation 355, a contact structure is formed to electrically connect the conductive material to the active region. The contact structure is formed by depositing a conductive material in the opening formed by the patterning of the dielectric material in operation 350. In some embodiments, forming the contact structure includes forming a silicide material over the active region. In some embodiments, forming the silicide material includes depositing a conductive material, such as nickel over the active region and performing an annealing process. In some embodiments, depositing the conductive material of the contact structure includes plating, PVD, or another suitable deposition process. In some embodiments, the conductive material of the contact structure include copper, aluminum, tungsten, cobalt, alloys therefor, or another suitable conductive material.

FIG. 4J is a cross-sectional view of a semiconductor device 400J in accordance with some embodiments. In some embodiments, the semiconductor device 400J is formed by the operation 355 of the method 300 (FIG. 3). In some embodiments, the semiconductor device 400J is formed using a process different from the operation 355. The semiconductor device 400J is similar to the semiconductor device 400I (FIG. 4I); and similar elements have the same reference number. In comparison with the semiconductor device 400I (FIG. 4I), the semiconductor device 400J includes the extended S/D contact structure 150 in the opening 460; and the S/D contact structure 155 in the opening 465.

Returning to FIG. 3, in operation 360, a backside of the through via is exposed. The operation 360 removes the substrate on an opposite side of the active regions to expose a conductive material of the through via to permit electrical connection to the conductive material from the side of the substrate opposite to the active regions. In some embodiments, the removal process includes grinding, CMP, etching or another suitable removal process.

Figure 7:
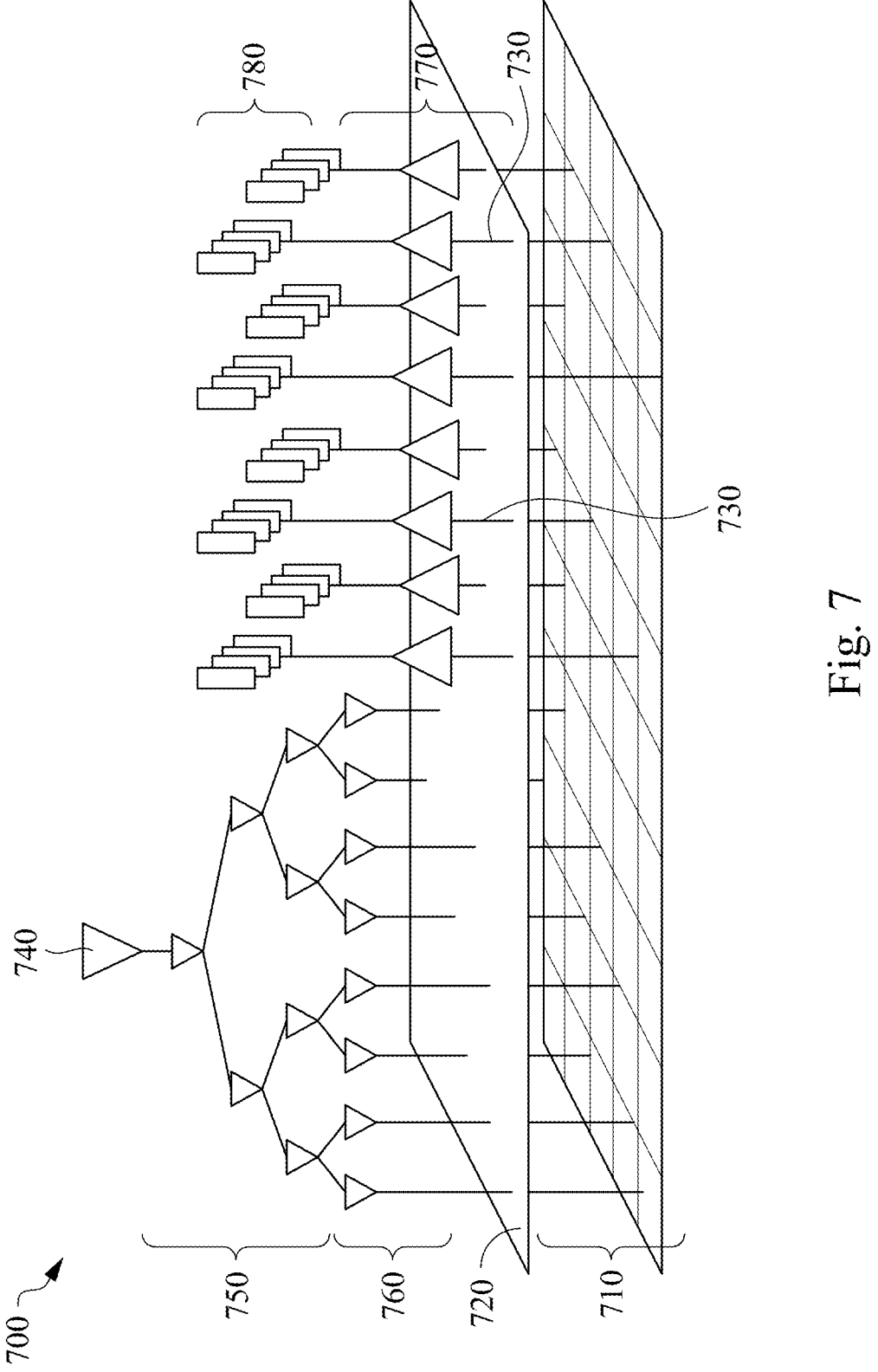
FIG. 7 is a perspective view of a semiconductor device in accordance with some embodiments.

In operation 365, a conductive mesh is formed on the backside of the substrate to electrically connect to the active region using the through via. In some embodiments, the conductive mesh includes a power mesh, a clocking mesh, or another suitable interconnect structure. In some embodiments, the conductive mesh is formed by depositing a dielectric material on the backside of the substrate and performing lithography and etching processes to define openings in the dielectric material. The openings are then filled with conductive material to define the conductive mesh. In some embodiments, forming the conductive mesh includes forming multiple layers of dielectric material with each layer including conductive material to define an interconnect structure. In some embodiments, the conductive mesh is call as backside mesh. In some embodiments, the conductive mesh is similar to the conductive mesh 710 (FIG. 7).

One of ordinary skill in the art would recognize that modifications to the method 300 are within the scope of this description. For example, one of ordinary skill in the art would recognize that the method 300 is described with respect to an extended S/D contact structure; however, the method 300 is adjustable to form an extended gate structure as well. In some embodiments, an order of operations of the method 300 is changed. For example, in some embodiments, operation 365 is performed prior to operation 305 where a backside of the substrate is processed prior to the front side of the substrate. In some embodiments, additional operations are included in the method 300. For example, in some embodiments, an interconnect structure is formed on a front side of the substrate to electrically connect devices on the front side of the substrate to one another. In some embodiments, at least one operation of the method 300 is omitted. For example, in some embodiments, at least one of operation 325 or operation 330 is omitted.

Figure 5A:
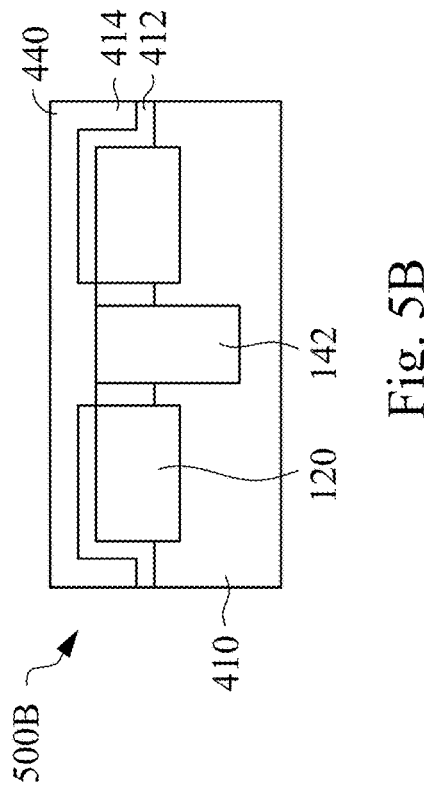
FIGS. 5A-5D are cross-sectional view of a semiconductor device at intermediate stages of manufacture in accordance with some embodiments.

FIGS. 5A-5D are cross-sectional views of a semiconductor device at intermediate stages of manufacture in accordance with some embodiments. The semiconductor device of FIGS. 5A-5D is not an entirety of the semiconductor device and the portion of the semiconductor device in FIGS. 5A-5D is used to depict changes in the structure during the manufacturing process. In comparison with FIGS. 4A-4J, the views in FIGS. 5A-5D include a cross-section of the semiconductor device in, which a protection layer is not formed in a through via opening, e.g., operation 325 and operation 330 of the method 300 (FIG. 3) are omitted. FIG. 5A is a cross-sectional view of a semiconductor device 500A following forming a conductive material 142 in a through via opening. In some embodiments, the semiconductor device 500A is formed by the operation 335 of the method 300 (FIG. 3), where operation 325 and operation 330 are omitted. In some embodiments, the semiconductor device 500A is formed using a process different from the operation 335. The conductive material 142 of the semiconductor device 500A directly contacts the substrate 410 and the hardmask layer 412.

Figure 5B:
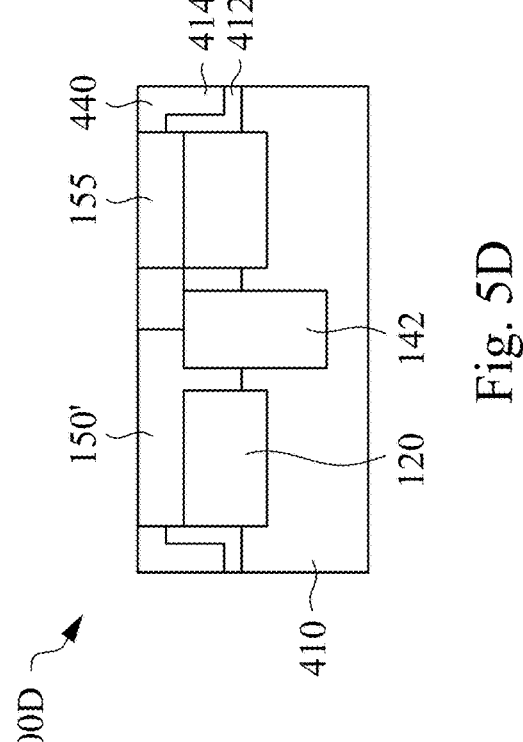

FIG. 5B is a cross-sectional view of a semiconductor device 500B following forming dielectric layer 440. In some embodiments, the semiconductor device 500B is formed by the operation 345 of the method 300 (FIG. 3), where operation 325 and operation 330 are omitted. In some embodiments, the semiconductor device 500B is formed using a process different from the operation 345. In comparison with the semiconductor device 500A (FIG. 5A), the semiconductor device 500B includes the dielectric layer 440 over the conductive material 142 and the active regions 120.

Figure 5C:
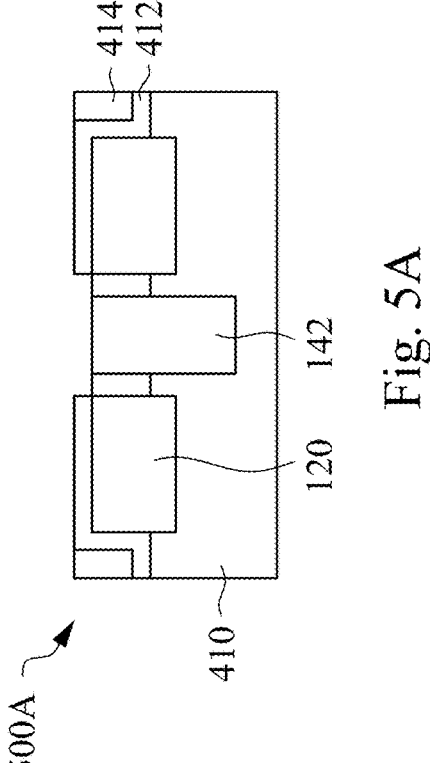

FIG. 5C is a cross-sectional view of a semiconductor device 500C following forming of openings in the dielectric layer 440. In some embodiments, the semiconductor device 500C is formed by the operation 350 of the method 300 (FIG. 3), where operation 325 and operation 330 are omitted. In some embodiments, the semiconductor device 500C is formed using a process different from the operation 350. In comparison with the semiconductor device 500B (FIG. 5B), the semiconductor device 500C includes the opening 560 exposing a top surface of the conductive material 142 and a portion of the sidewall of the conductive material 142. The semiconductor device 500C further includes opening 565, which does not expose any of the conductive material 142.

Figure 5D:
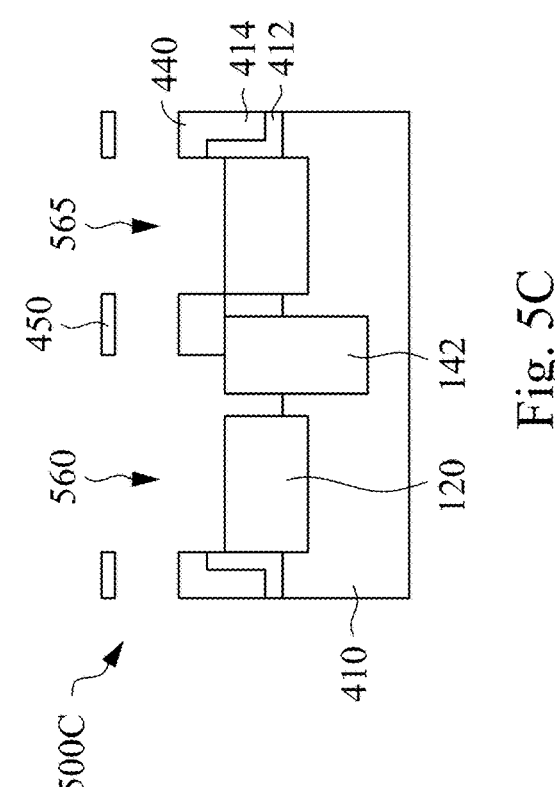

FIG. 5D is a cross-sectional view of a semiconductor device 500D following forming of an extended S/D contact structure 150' and an S/D contact structure 155. In some embodiments, the semiconductor device 500D is formed by the operation 355 of the method 300 (FIG. 3), where operation 325 and operation 330 are omitted. In some embodiments, the semiconductor device 500D is formed using a process different from the operation 355. In comparison with the semiconductor device 500C (FIG. 5C), the semiconductor device 500D includes the extended S/D contact structure 150' in the opening 560; and the S/D contact structure 155 in the opening 565. In comparison with the semiconductor device 400J (FIG. 4J), the semiconductor device 500D includes an entirety of the bottom surface of the extended S/D contact structure 150' between the active region 120 and the conductive material 142 contacts the substrate. That is, a portion of the bottom surface of the extended S/D contact structure 150 (FIG. 4J) contacts the protection layer 144, which is not present in the semiconductor device 500D.

Figure 21:
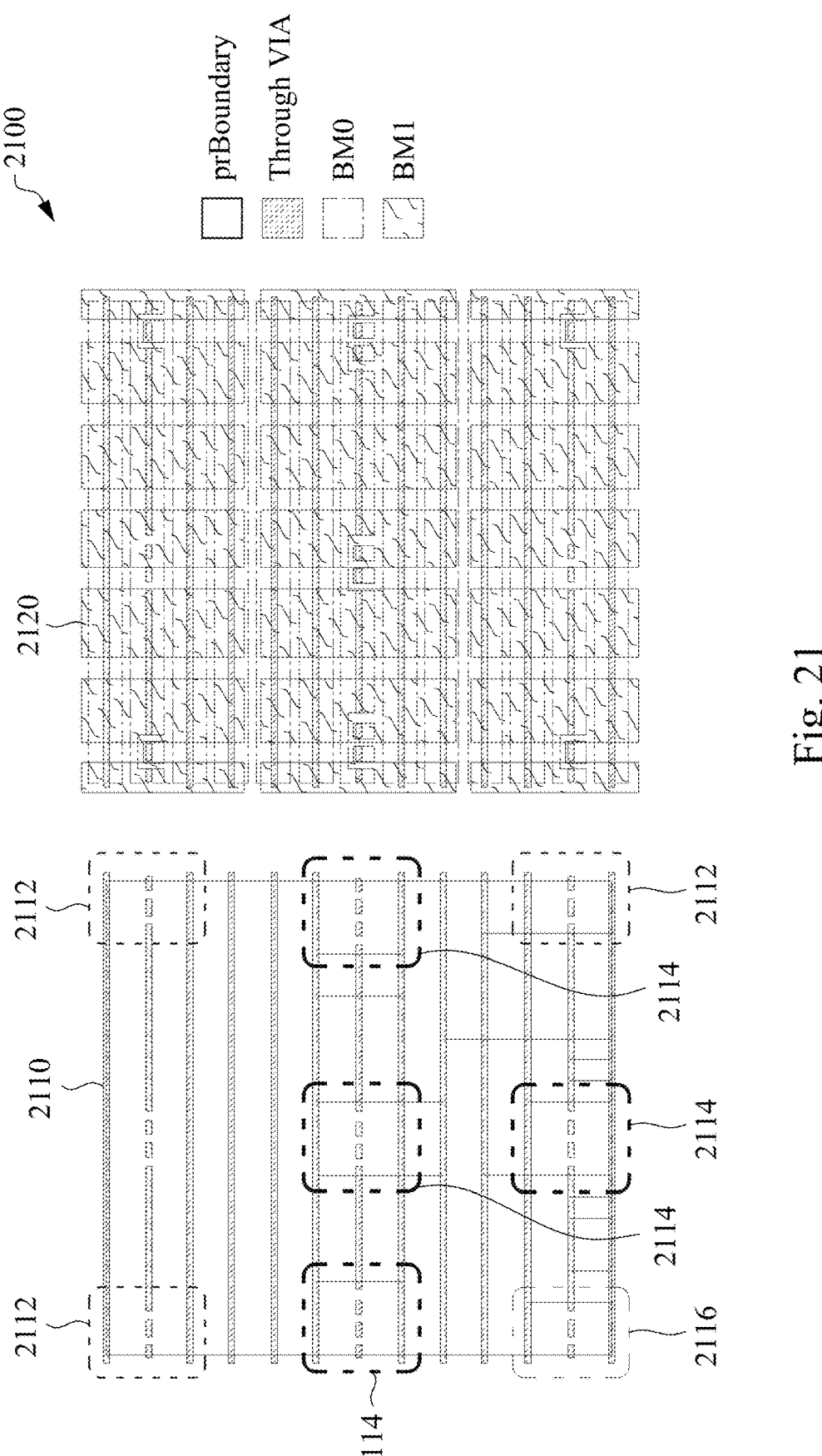
FIG. 21 is a top view of a semiconductor device and a bottom view of a semiconductor device in accordance with some embodiments.

FIG. 6 is a view of a layout of a semiconductor device 600 in accordance with some embodiments. The layout view of the semiconductor device 600 is a top view. The semiconductor device 600 is usable to clarify dimensions within the semiconductor device 600 that are applicable to the semiconductor device 100 (FIG. 1A), the semiconductor device 200 (FIG. 2A), the semiconductor device 700 (FIG. 7), the semiconductor device 800A (FIG. 8A), the semiconductor device 900A (FIG. 9A), the semiconductor device 1000A (FIG. 10A), the semiconductor device 1100A (FIG. 11A), the semiconductor device 1100B (FIG. 11B), the semiconductor device 1100C (FIG. 11C), the semiconductor device 1200A (FIG. 12A), the semiconductor device 1300A (FIG. 13A), the semiconductor device 1400A (FIG. 14A), the semiconductor device 1500 (FIG. 15), the semiconductor device 1600 (FIG. 16), the semiconductor device 1700 (FIG. 17), the semiconductor device 1800 (FIG. 18), the semiconductor device 1900 (FIG. 19), the semiconductor device 2000 (FIG. 20), or the semiconductor device 2100 (FIG. 21). True dimensions of the semiconductor device 600 are determined based on a manufacturing node of the semiconductor device 600. That is, a semiconductor device 600 manufactured using a manufacturing process for a larger manufacturing node would have larger dimensions than the semiconductor device 600 manufactured for a smaller manufacturing node. A dimension N is used to provide relative dimensions D1-D6. A value of N ranges from 0.3 Lg to 1.8 Lg, where Lg is a minimum gate length that is able to be reliably manufacturing for a manufacturing node of the semiconductor device 600. If the value of N is too small, a risk of manufacturing error that produces a defective product increases, in some instances. If the value of N is too large, then a size of the semiconductor device 600 is increased without a noticeable increase in performance, in some instances. One of ordinary skill in the art would understand the acronyms in FIG. 6 as continuous polysilicon line over active region edge (CPODE) level, metal diffusion (MD) level, polysilicon (PO) level, via over diffusion (VD) level, via over gate (VG) level, through VIA (TVIA) level, metal 0 (M0) level, backside metal 0 (BM0) level, via 0 (VIA0) level, and metal 1 (M1) level of the layout of the semiconductor device 600, in some embodiments.

The semiconductor device 600 includes a dimension D1 of a through via, such as through via 140 (FIG. 1A), in a first direction ranging from 0.9 N to 1.1 N. If the dimension D1 is too large, then a size of the semiconductor device 600 is increased without a noticeable improvement in performance, in some instances. If the dimension D1 is too small, then manufacturing of the through via has an increased risk of manufacturing error, in some instances. The semiconductor device 600 includes a dimension D2 of the through via, such as through via 140 (FIG. 1A), in a second direction, perpendicular to the first direction, ranging from 1.5 N to 5 N. If the dimension D2 is too large, then a size of the semiconductor device 600 is increased without a noticeable improvement in performance, in some instances. If the dimension D2 is too small, then manufacturing of the through via has an increased risk of manufacturing error, in some instances.

The semiconductor device 600 includes a dimension D3 of separation between adjacent backside mesh structures, such as structure in the conductive mesh 710 (FIG. 7), in the first direction ranging from 0.5 N to 2 N. If the dimension D3 is too large, then a size of the semiconductor device 600 is increased without a noticeable improvement in performance, in some instances. If the dimension D3 is too small, then manufacturing of the backside mesh has an increased risk of manufacturing error, in some instances. The semiconductor device 600 includes a dimension D4 of a backside mesh component in the first direction ranging from N to 4 N. If the dimension D4 is too large, then a size of the semiconductor device 600 is increased without a noticeable improvement in performance, in some instances. If the dimension D4 is too small, then manufacturing of the backside mesh has an increased risk of manufacturing error, in some instances.

The semiconductor device 600 includes a dimension D5 of a pitch between adjacent gate structures, such as gate structures 130 (FIG. 1A), in the second direction ranging from 2N to 8N. If the dimension D5 is too large, then a size of the semiconductor device 600 is increased without a noticeable improvement in performance, in some instances. If the dimension D5 is too small, then manufacturing of the semiconductor device has an increased risk of manufacturing error, in some instances. The semiconductor device 600 includes a dimension D6 of a distance between aligned gate structures, such as gate structures 130 (FIG. 1A), in the first direction ranging from N to 3 N. If the dimension D6 is too large, then a size of the semiconductor device 600 is increased without a noticeable improvement in performance, in some instances. If the dimension D6 is too small, then manufacturing of the semiconductor device has an increased risk of manufacturing error, in some instances.

FIG. 7 is a perspective view of a semiconductor device 700 in accordance with some embodiments. The semiconductor device 700 includes a large scale example implemented using the through via structures as described above, such as with respect to the semiconductor device 100 (FIG. 1A) or the semiconductor device 200 (FIG. 2A). The semiconductor device 700 includes a conductive mesh 710 on a backside of a substrate 720. A plurality of through vias 730 extend through the substrate to electrically connect the conductive mesh 710 with a device on a front side of the substrate 720. The semiconductor device further includes a clock source 740. The clock source 740 is connected to a plurality of pre-mesh drivers 750. The plurality of pre-mesh drivers 750 are electrically connected to a plurality of mesh drivers 760. Each of the mesh drivers 760 is electrically connected to the conductive mesh 710 by a corresponding through via 730. The semiconductor device 700 further includes a plurality of buffers 770. Each of the plurality of buffers 770 is electrically connected to the conductive mesh 710 by a corresponding through via 730. The plurality of buffers 770 is electrically connected to a plurality of loads 780.

In approaches that include a conductive mesh on the front side of the substrate, connections for devices are routed around a periphery of the front side conductive mesh. By routing the connections around the periphery of the front side conductive mesh, the overall size of the device is increased without an increase in functionality. Using the conductive mesh 710 on the backside of the substrate 720 in combination with the through vias 730, the semiconductor device 700 is able to simplify the routing of connections between components on the front side of the substrate 720 in comparison with other approaches. The simplification of the routing of connections means that a size of the semiconductor device 700 is not increased merely to provide sufficient routing options to connect the components on the front side of the substrate. Additional details of some components of the semiconductor device 700 are discussed below.

Figure 8A:
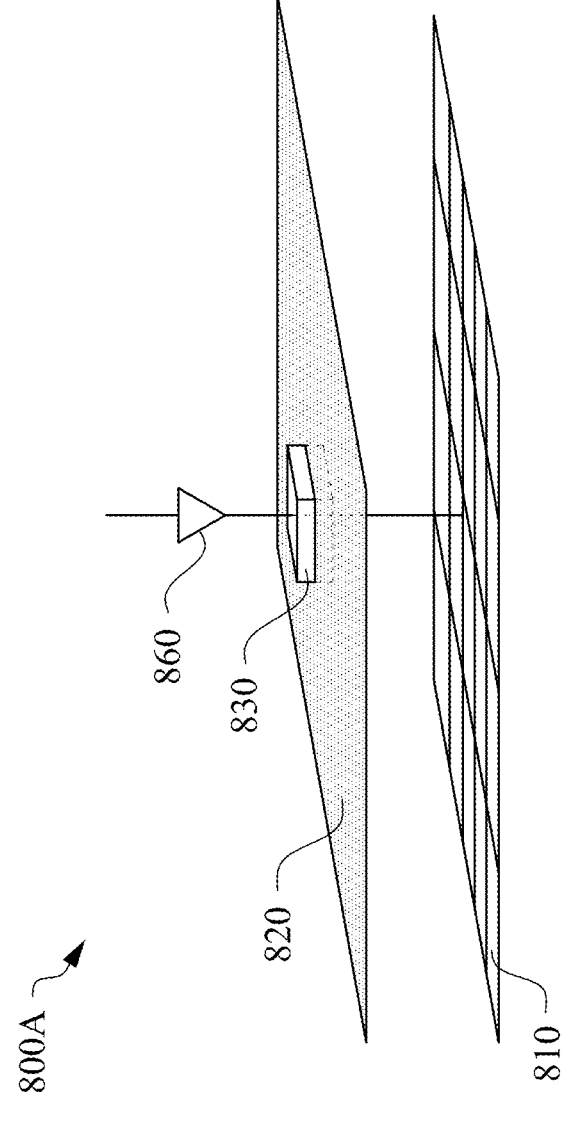
FIG. 8A is a perspective view of a semiconductor device in accordance with some embodiments.

FIG. 8A is a perspective view of a semiconductor device 800A in accordance with some embodiments. In some embodiments, the semiconductor device 800A is usable as a portion of the semiconductor device 700 (FIG. 7); and similar components have a same reference number increased by 100. The semiconductor device 800A includes a conductive mesh 810 on a backside of a substrate 820. The conductive mesh 810 is electrically connected to a driver 860 on a front side of the substrate 820 by a through via 830.

Figure 9A:
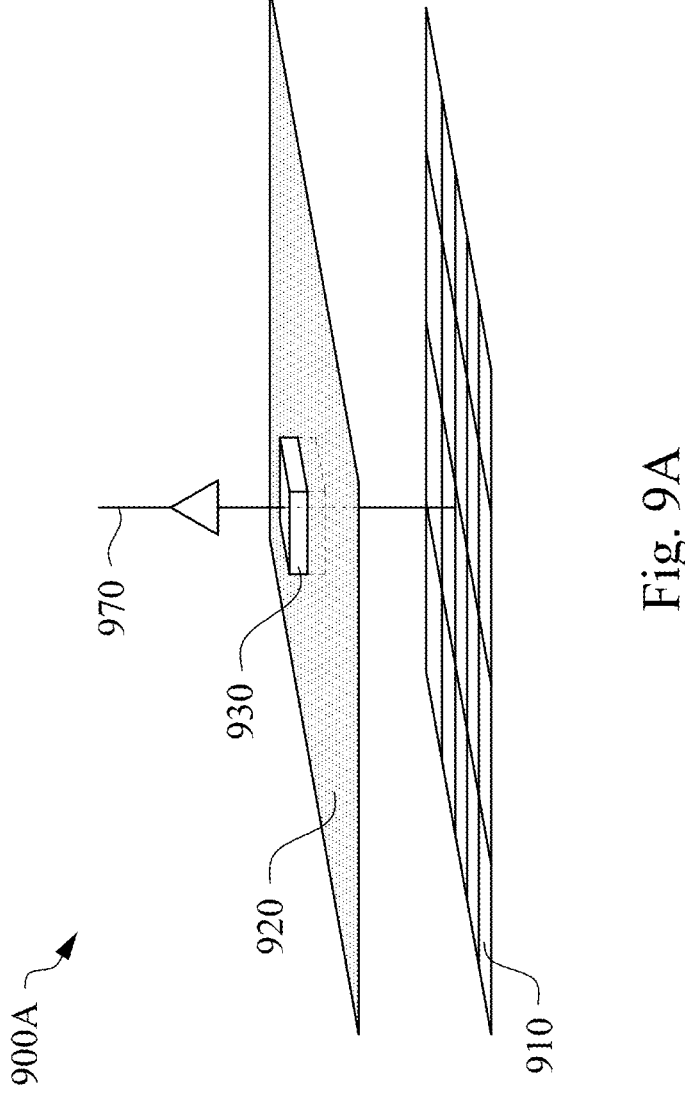
FIG. 9A is a perspective view of a semiconductor device in accordance with some embodiments.

FIG. 8B is a view of a layout of a semiconductor device 800B in accordance with some embodiments. The layout view of the semiconductor device 800B includes components of the semiconductor device 800A. The semiconductor device 800B includes a through via 830 configured to receive an output of the driver 860 on the front side of the substrate 820. The conductive mesh 810 is not visible in the layout of FIG. 8B. However, one of ordinary skill in the art would recognize that through via 830 is electrically connected to the conductive mesh 810. The semiconductor device 800B further includes a first set of through vias 870 configured to convey a first power signal from the backside of the substrate 820 to the front side of the substrate 820. In some embodiments, the first power signal is a reference voltage, such as VSS. The semiconductor device 800B further includes a second set of through vias 880 configured to convey a second power signal from the backside of the substrate 820 to the front side of the substrate 820. In some embodiments, the second power signal is a supply power, e.g., VDD. One of ordinary skill in the art would understand the acronyms in FIG. 8B as follows cut polysilicon (CPO) level, metal diffusion (MD) level, polysilicon (PO) level, via over diffusion (VD) level, via over gate (VG) level, through VIA (TVIA) level, metal 0 (M0) level, contact end cut (CMD) level, via 0 (VIA0) level, and metal 1 (M1) level of the layout of the semiconductor device 800B, in some embodiments FIG. 9A is a perspective view of a semiconductor device 900A in accordance with some embodiments. In some embodiments, the semiconductor device 900A is usable as a portion of the semiconductor device 700 (FIG. 7); and similar components have a same reference number increased by 200. The semiconductor device 900A includes a conductive mesh 910 on a backside of a substrate 920. The conductive mesh 910 is electrically connected to a buffer 970 on a front side of the substrate 920 by a through via 930.

FIG. 9B is a view of a layout of a semiconductor device 900B in accordance with some embodiments. The layout view of the semiconductor device 900B includes components of the semiconductor device 900A. The semiconductor device 900B includes a through via 930 configured to provide an input to the buffer 970 on the front side of the substrate 920. The conductive mesh 910 is not visible in the layout of FIG. 9B. However, one of ordinary skill in the art would recognize that through via 930 is electrically connected to the conductive mesh 910. The semiconductor device 900B further includes a first set of through vias 980 configured to convey a first power signal from the backside of the substrate 920 to the front side of the substrate 920. In some embodiments, the first power signal is a reference voltage, such as VSS. The semiconductor device 900B further includes a second set of through vias 990 configured to convey a second power signal from the backside of the substrate 920 to the front side of the substrate 920. In some embodiments, the second power signal is a supply power, e.g., VDD.

Figure 10A:
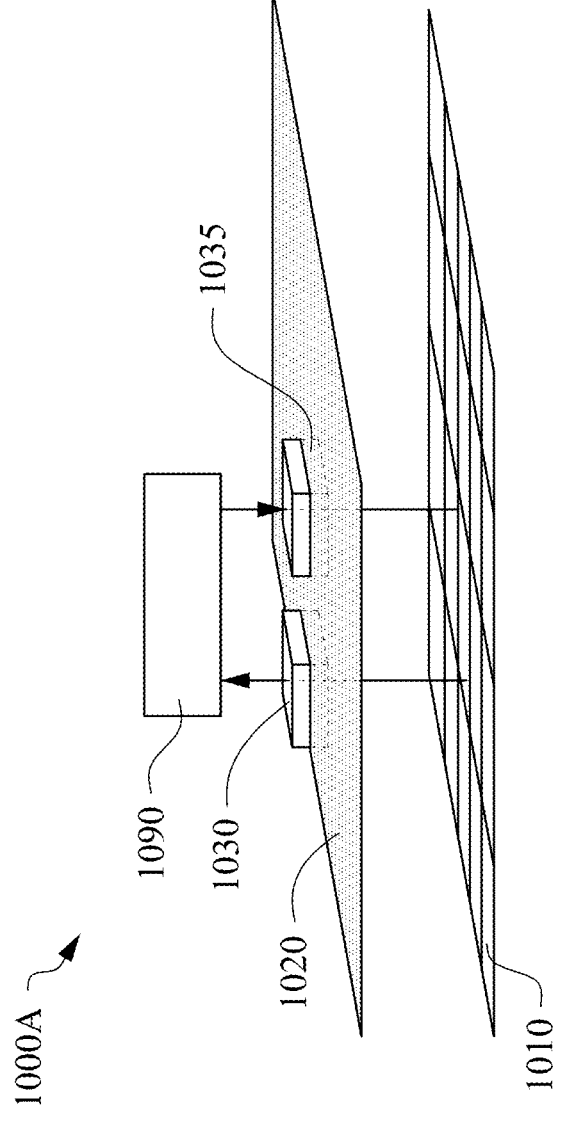
FIG. 10A is a perspective view of a semiconductor device in accordance with some embodiments.

FIG. 10A is a perspective view of a semiconductor device 1000A in accordance with some embodiments. In some embodiments, some components of the semiconductor device 1000A are similar to components of the semiconductor device 700 (FIG. 7); and similar components have a same reference number increased by 300. The semiconductor device 1000A includes a conductive mesh 1010 on a backside of a substrate 1020. The conductive mesh 1010 is electrically connected to a relay cell 1090 on a front side of the substrate 1020 by a through via 1030 and a through via 1035.

FIG. 10B is a view of a layout of a semiconductor device 1000B in accordance with some embodiments. The layout view of the semiconductor device 1000B includes components of the semiconductor device 1000A. The semiconductor device 1000B includes a through via 1030 configured to receive an output of the relay cell 1090 and a through via 1035 to provide an input to the relay cell 1090. The conductive mesh 1010 is not visible in the layout of FIG. 10B. However, one of ordinary skill in the art would recognize that at least one of through via 1030 or through via 1035 is electrically connected to the conductive mesh 1010. The semiconductor device 1000B further includes a first set of through vias 1092 configured to convey a first power signal from the backside of the substrate 1020 to the front side of the substrate 1020. In some embodiments, the first power signal is a reference voltage, such as VSS. The semiconductor device 1000B further includes a second set of through vias 1094 configured to convey a second power signal from the backside of the substrate 1020 to the front side of the substrate 1020. In some embodiments, the second power signal is a supply power, e.g., VDD.

Figure 11A:
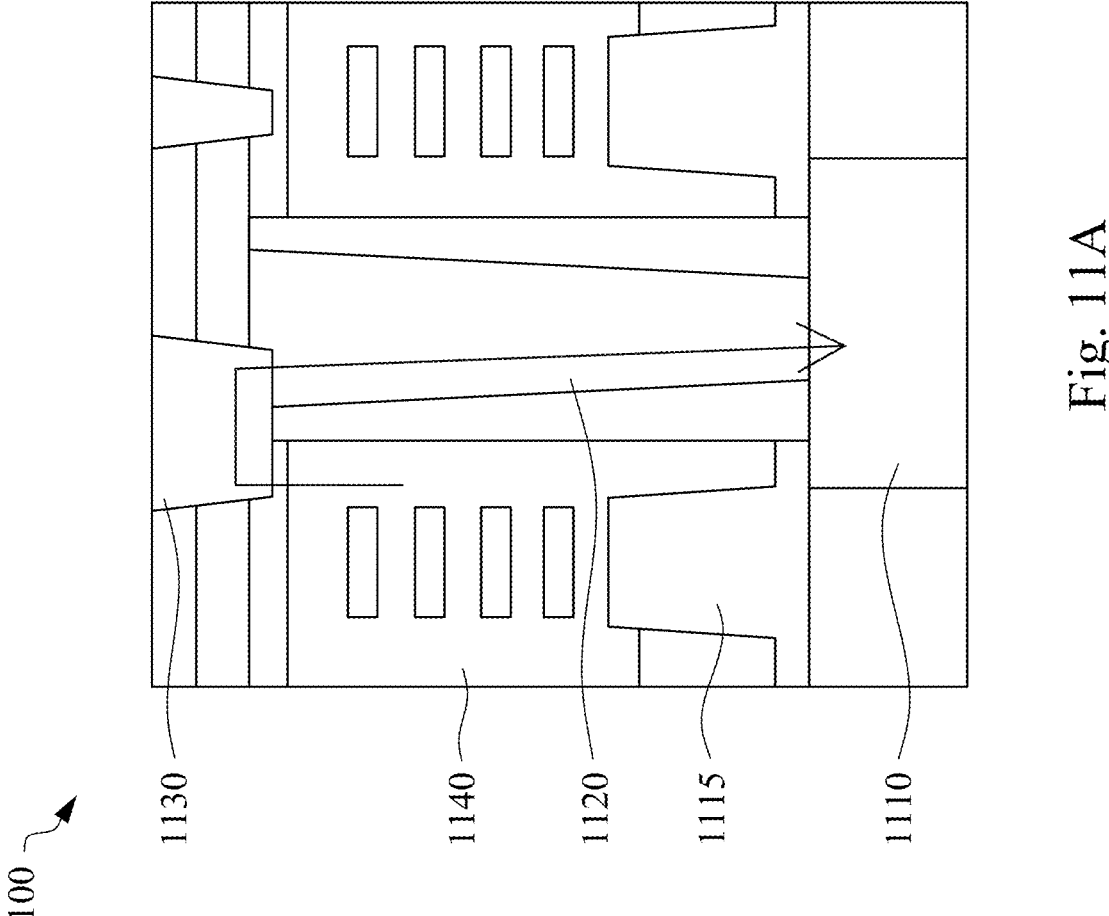
FIG. 11A is a cross-sectional view of a semiconductor device in accordance with some embodiments.

FIG. 11A is a cross-sectional view of a semiconductor device 1100 in accordance with some embodiments. The semiconductor device 1100 includes a conductive mesh 1110. The conductive mesh 1110 is electrical connected to a through via 1120 that extends through a substrate 1115. The though via 1120 is electrically connected to a gate structure 1140 by a gate contact structure 1130. In some embodiments, the conductive mesh 1110 is similar to the conductive mesh 710 (FIG. 7). In some embodiments, the through via 1120 is similar to the through via 240 (FIG. 2B). In some embodiments, the gate contact structure 1130 is similar to the extended gate contact 230 (FIG. 2B). In some embodiments, the gate structure 1140 defines a gate structure for a GAA transistor. Using the through via 1120 allows a conductivity of a transistor having the gate structure 1140 be controlled based on a signal from the conductive mesh 1110 without alignment between the through via 1120 and the gate structure 1140. This ability to provide connection without alignment between the through via 1120 and the gate structure 1140 helps to improve production yield and simplify manufacturing processes.

Figure 11C:
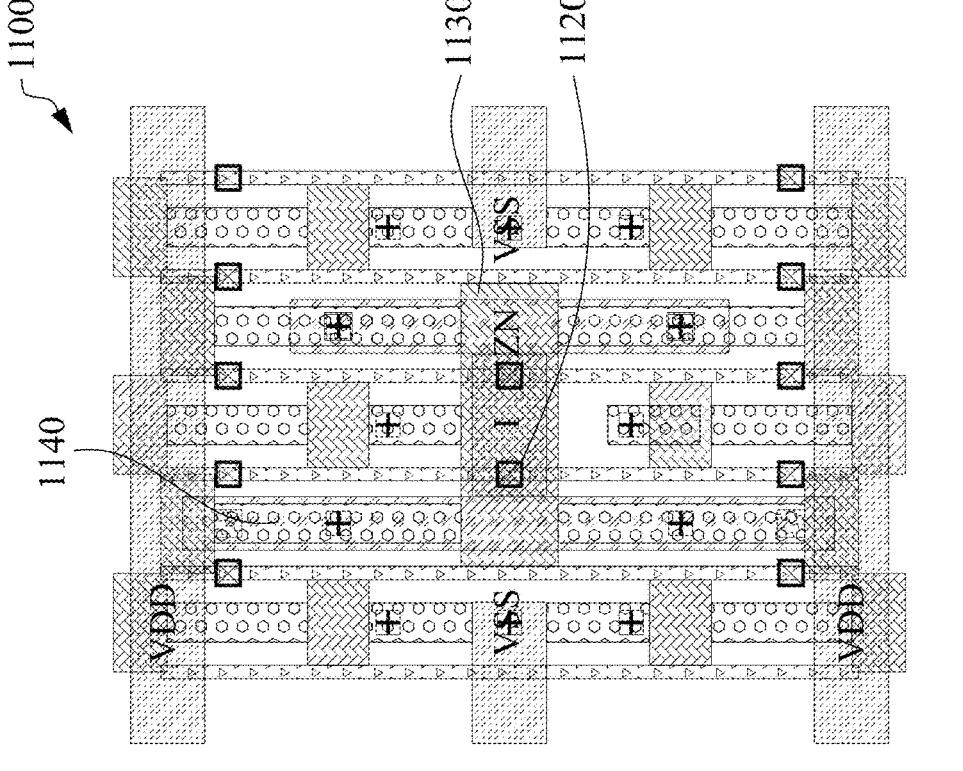
FIG. 11C is a view of a layout of a semiconductor device in accordance with some embodiments.
Figure 11B:
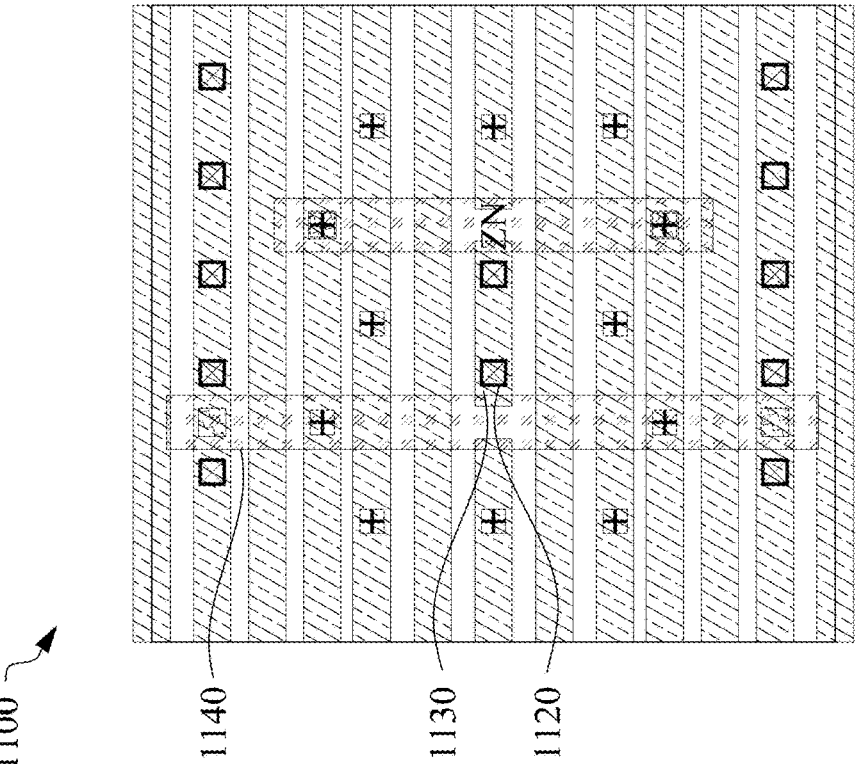
FIG. 11B is a view of a layout of a semiconductor device in accordance with some embodiments.

FIG. 11B is a view of a layout of the semiconductor device 1100 in accordance with some embodiments. The view in FIG. 11B helps to show how the through via 1120 is able to electrically connect to the gate structure 1140 by using a contact structure 1130 despite the through via 1120 being completely offset from the gate structure 1140. That is, the entirety of the through via 1120 is outside of a periphery of the gate structure 1140 in a top view. FIG. 11C is a view of a layout of the semiconductor device 1100 in accordance with some embodiments. Similar to the view in FIG. 1B, the view in FIG. 11C helps to show how the through via 1120 is able to electrically connect to the gate structure 1140 by using a contact structure 1130 despite the through via 1120 being completely offset from the gate structure 1140.

Figure 12A:
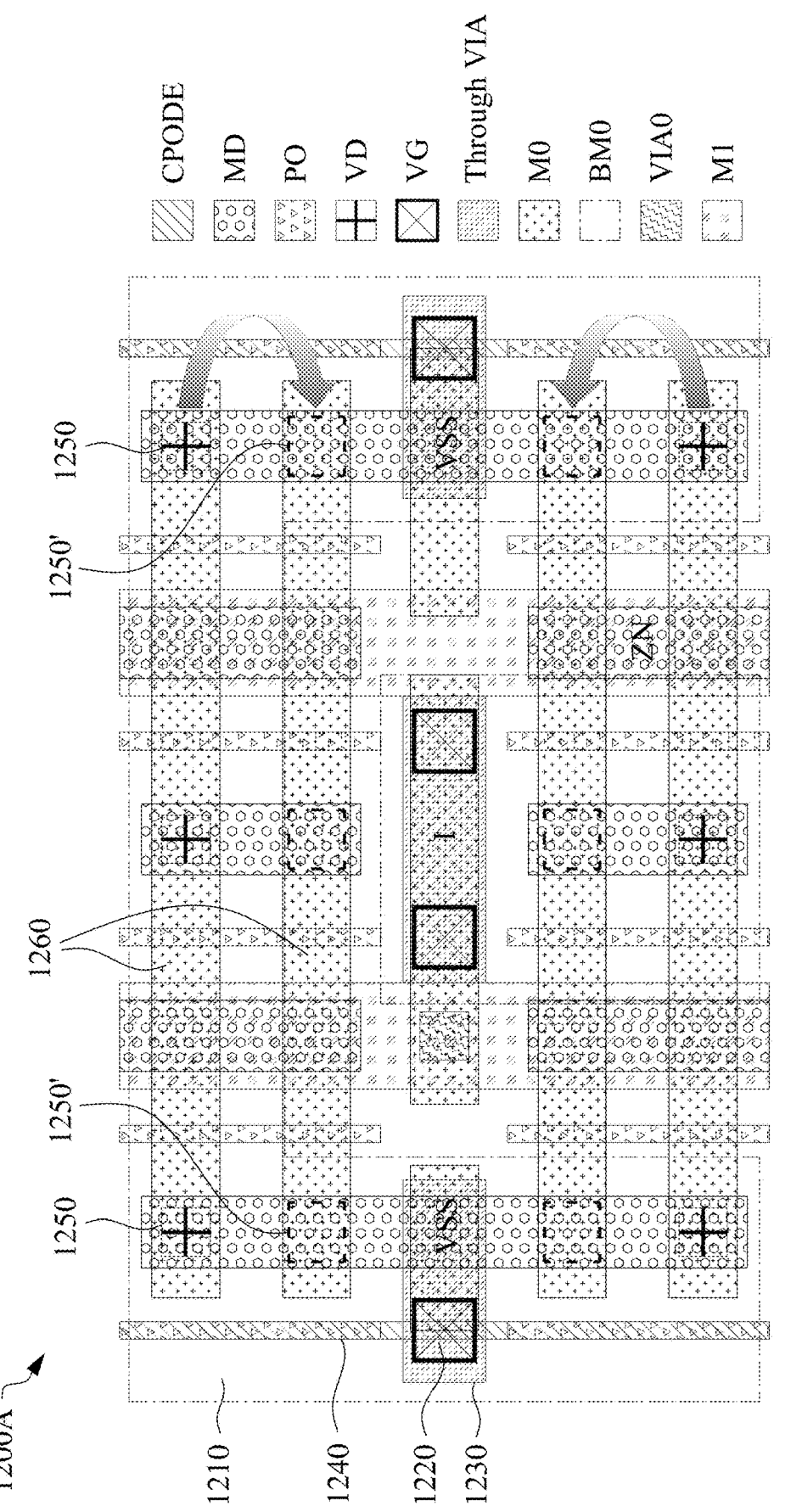
FIG. 12A is a view of a layout of a semiconductor device in accordance with some embodiments.

FIG. 12A is a view of a layout of a semiconductor device 1200A in accordance with some embodiments. The semiconductor device 1200A includes an electrical connection to a shielding track on a front side of a substrate from a backside conductive mesh using a through via. The semiconductor device 1200A includes a backside conductive mesh 1210 electrically connected to a ground via 1220 by a through via 1230 that extends through a substrate of the semiconductor device 1200A. The ground via 1220 is electrically connected to the shielding track 1240 in order to provide a reference voltage, e.g., VSS, to the shielding track 1240. The shielding track 1240 helps to electrically isolate the semiconductor device 1200A in order to reduce the impact of electrical fields outside of the semiconductor device 1200A on the internal performance of the semiconductor device 1200A.

By including the through via 1230 in the semiconductor device 1200A, additional vias 1250 along routing tracks 1260 at a periphery of the semiconductor device 1200A are able to be moved to via sites 1250' closer to a center of the semiconductor device 1200A. In an arrangement where a via is positioned directly aligned with the S/D contact (MD) at the location where the through via 1230 is located, the via sites 1250' would be unavailable because vias cannot be placed on adjacent routing tracks 1260. As a result, the vias 1250 are spaced farther apart and the size of the device would be increased without an increase in functionality. However, by including the arrangement of the through via 1230 and the ground via 1220, the vias 1250 are able to move to the via sites 1250' and the size of the semiconductor device 1200A is able to be reduced.

Figure 12B:
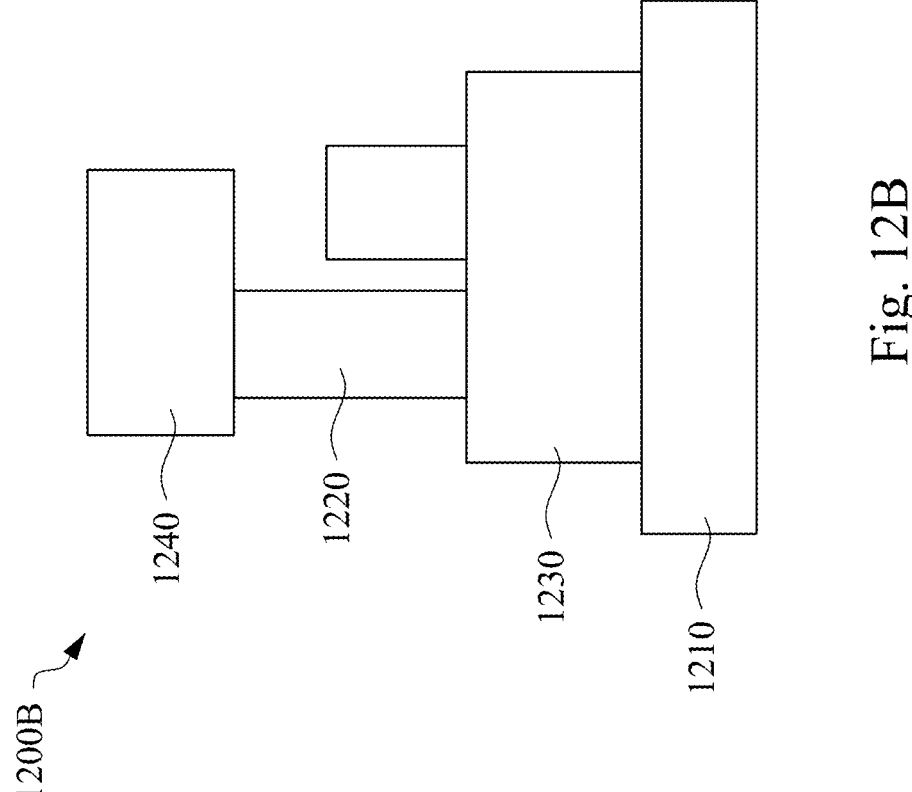
FIG. 12B is a cross-sectional view of a portion of a semiconductor device in accordance with some embodiments.

FIG. 12B is a cross-sectional view of a portion 1200B of a semiconductor device 1200A in accordance with some embodiments. The portion 1200B includes components of the semiconductor device 1200A (FIG. 12A); and similar elements have a same reference number. The view in FIG. 12B helps to show the connection between the conductive mesh 1210 and the shielding track 1240.

Figure 13A:
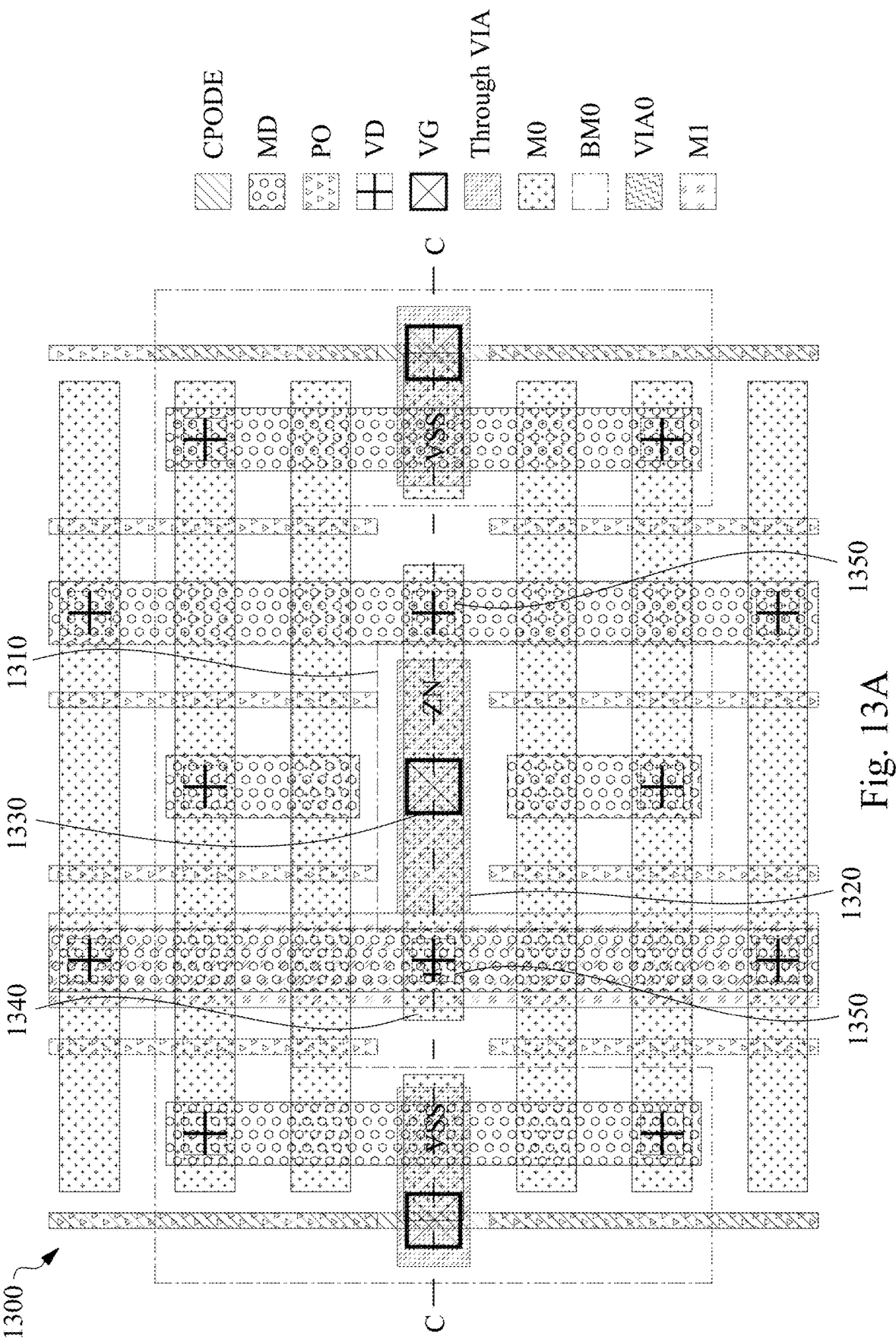
FIG. 13A is a view of a layout of a semiconductor device in accordance with some embodiments.

FIG. 13A is a view of a layout of a semiconductor device 1300 in accordance with some embodiments. The semiconductor device 1300 includes a conductive mesh 1310 on a backside of a substrate. The conductive mesh 1310 is electrically connected by a through via 1320 to a via 1330 on the front side of the substrate. The via 1330 is electrically connected to a plurality of S/D contacts 1350 by a conductive line 1340. Using the through via 1320 in the semiconductor device 1300 avoid designing a semiconductor device having two separate vias aligned with each of the S/D regions electrically connected to the corresponding S/D contacts 1350. Avoiding the alignment issues helps to improve production yield and reduce the risk of manufacturing error.

Figure 13B:
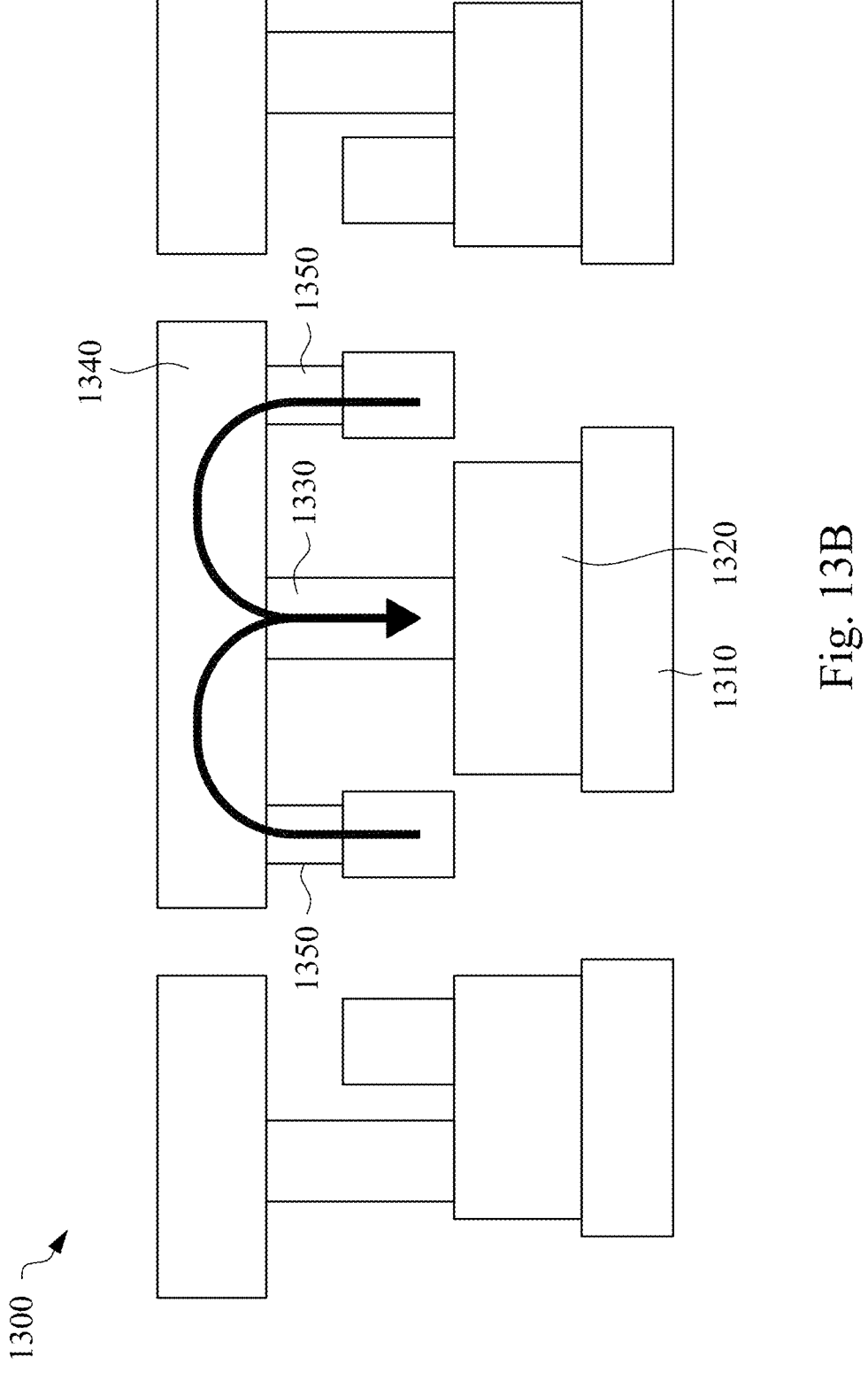
FIG. 13B is a cross-sectional view of a portion of a semiconductor device in accordance with some embodiments.

FIG. 13B is a cross-sectional view of a portion of the semiconductor device 1300 in accordance with some embodiments. The view of FIG. 13B is taken along the line C-C of FIG. 13A. The view in FIG. 13B includes components of the semiconductor device 1300 and helps to show the connection between the conductive mesh 1310 and the S/D contacts 1350.

Figure 14A:
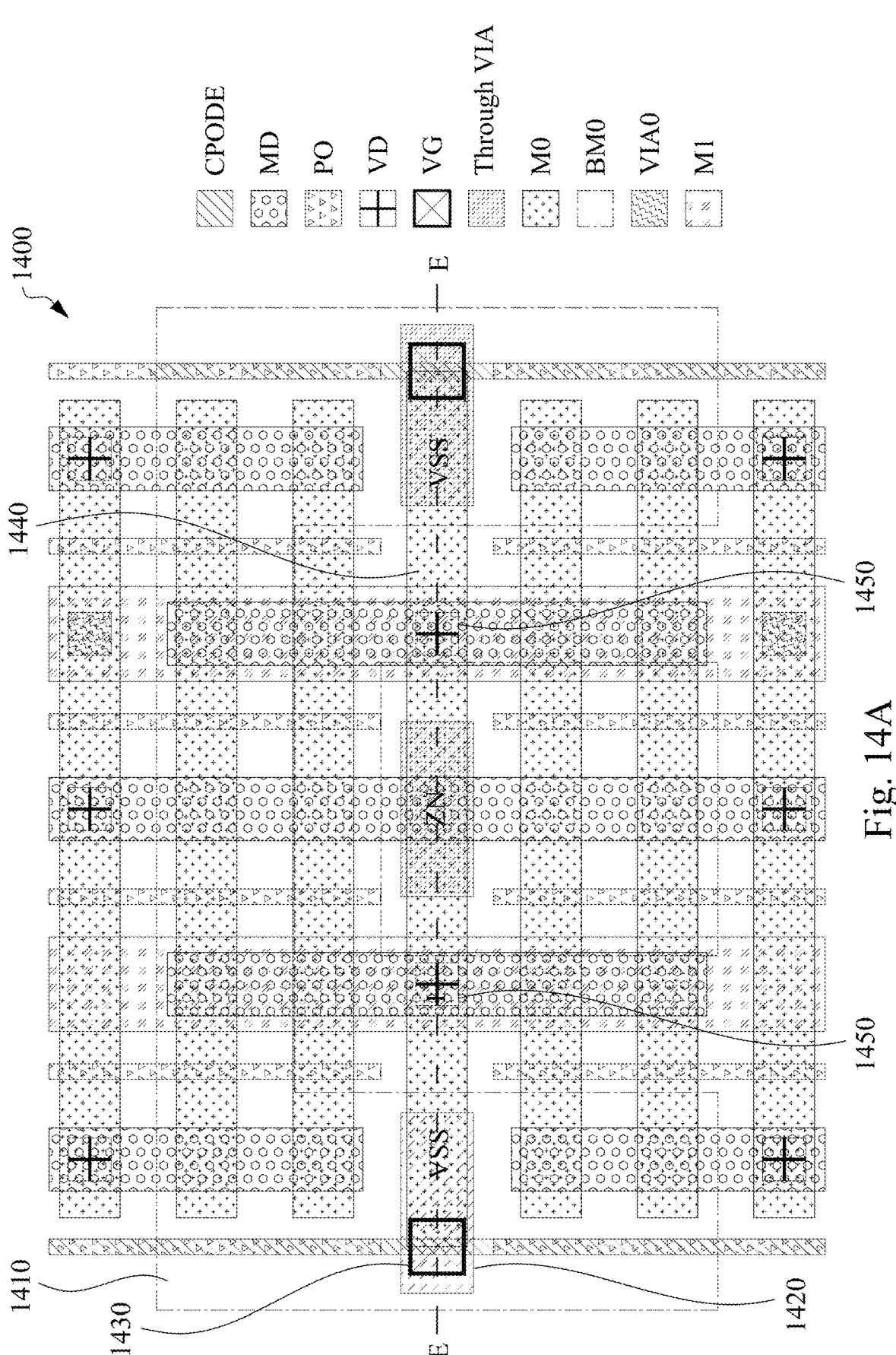
FIG. 14A is a view of a layout of a semiconductor device in accordance with some embodiments.

FIG. 14A is a view of a layout of a semiconductor device 1400 in accordance with some embodiments. The semiconductor device 1400 includes a conductive mesh 1410 on a backside of a substrate. The conductive mesh 1410 is electrically connected by a through via 1420 to a via 1430 on the front side of the substrate. The via 1430 is electrically connected to a plurality of S/D contacts 1450 by a conductive line 1440. Using the through via 1420 in the semiconductor device 1400 avoids designing a semiconductor device having vias aligned with each of the S/D regions electrically connected to the corresponding S/D contacts 1450. Avoiding the alignment issues helps to improve production yield and reduce the risk of manufacturing error.

Figure 14B:
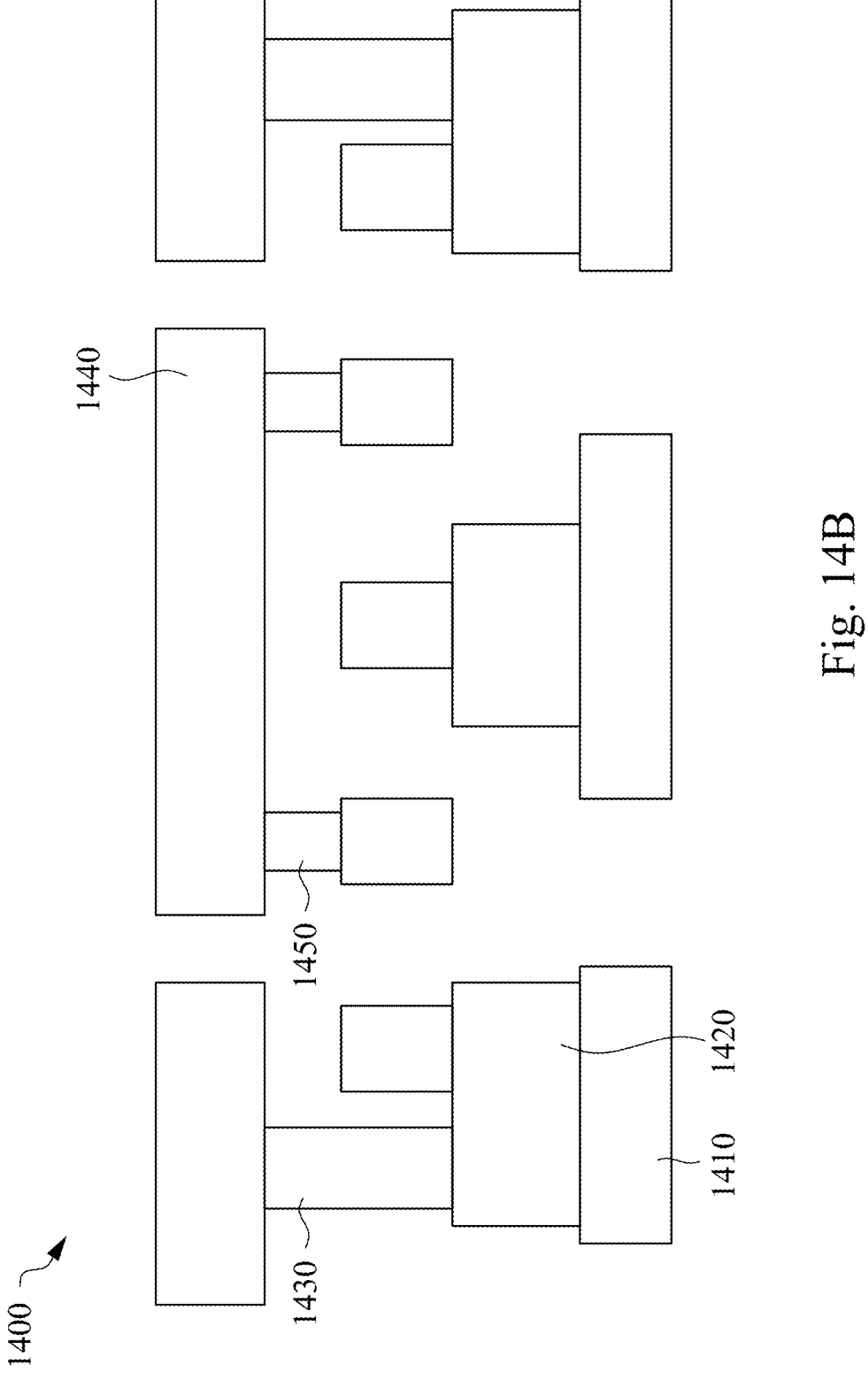
FIG. 14B is a cross-sectional view of a portion of a semiconductor device in accordance with some embodiments.

FIG. 14B is a cross-sectional view of a portion of the semiconductor device 1400 in accordance with some embodiments. The view of FIG. 14B is taken along the line E-E of FIG. 14A. The view in FIG. 14B includes components of the semiconductor device 1400 and helps to show the connection between the conductive mesh 1410 and the S/D contacts 1450.

FIG. 15 is a view of a layout of a semiconductor device 1500 in accordance with some embodiments. In some embodiments, the semiconductor device 1500 is an inverter configured to receive an input (I) from a through via. In some embodiments, the semiconductor device 1500 is configured to have a D8 driving capacity, where D8 is eight times D; and D is a unit of current driving capability for a corresponding transistor in a semiconductor device produced in a same technology node as the semiconductor device 1500. The semiconductor device 1500 includes a conductive mesh 1510 on a backside of a substrate. The conductive mesh 1510 is elected connected to a through via 1520 to electrically connect to a conductive line 1540 by a plurality of vias 1530. The semiconductor device 1500 further includes a connection 1550 to a shielding track, similar to the arrangement described in detail with respect to semiconductor device 1200A (FIG. 12A).

Figure 16:
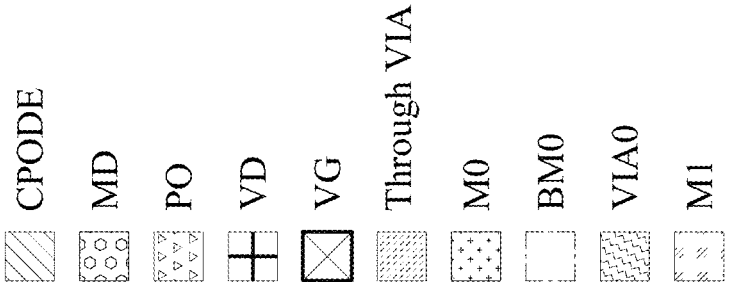
FIG. 16 is a view of a layout of a semiconductor device in accordance with some embodiments.

FIG. 16 is a view of a layout of a semiconductor device 1600 in accordance with some embodiments. In some embodiments, the semiconductor device 1600 is an inverter configured to receive provide an output (ZN) to a through via. In some embodiments, the semiconductor device 1600 is configured to have a D8 driving capacity. The semiconductor device 1600 includes a conductive mesh 1610 on a backside of a substrate. The conductive mesh 1610 is elected connected to a through via 1620 to electrically connect to a conductive line 1640 by a via 1630. The semiconductor device 1600 further includes a connection 1650 to a shielding track, similar to the arrangement described in detail with respect to semiconductor device 1200A (FIG. 12A).

Figure 17:
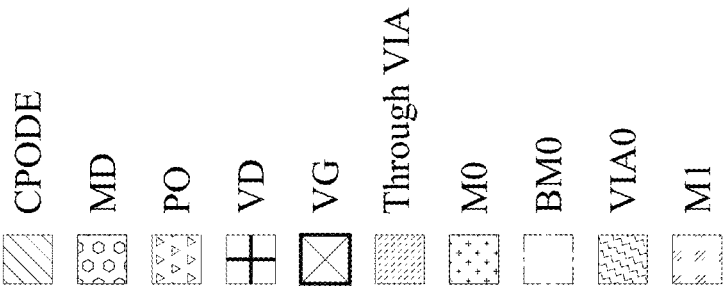
FIG. 17 is a view of a layout of a semiconductor device in accordance with some embodiments.

FIG. 17 is a view of a layout of a semiconductor device 1700 in accordance with some embodiments. In some embodiments, the semiconductor device 1700 is an inverter configured to provide an output to a through via. In some embodiments, the semiconductor device 1700 is configured to have a D8 driving capacity. The semiconductor device 1700 includes a conductive mesh 1710 on a backside of a substrate. The conductive mesh 1710 is elected connected to a through via 1720 to electrically connect to a conductive line 1740 by a via 1730. The semiconductor device 1700 further includes a connection 1750 to a shielding track, similar to the arrangement described in detail with respect to semiconductor device 1200A (FIG. 12A).

Figure 18:
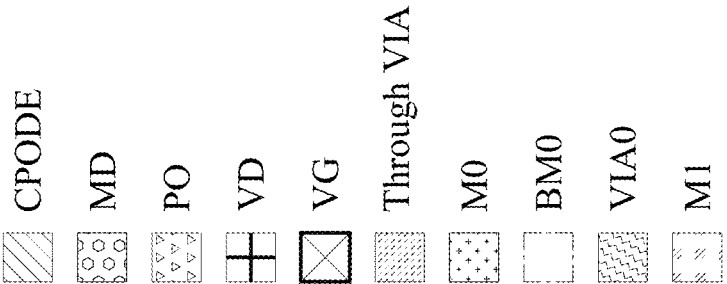
FIG. 18 is a view of a layout of a semiconductor device in accordance with some embodiments.

FIG. 18 is a view of a layout of a semiconductor device 1800 in accordance with some embodiments. In some embodiments, the semiconductor device 1800 is an inverter configured to provide an output to a through via. In some embodiments, the semiconductor device 1800 is configured to have a D8 driving capacity. The semiconductor device 1800 includes a conductive mesh 1810 on a backside of a substrate. The conductive mesh 1810 is elected connected to a through via 1820 to electrically connect to a conductive line 1840 by a via 1830. The semiconductor device 1800 further includes a connection 1850 to a shielding track, similar to the arrangement described in detail with respect to semiconductor device 1200A (FIG. 12A).

Figure 19:
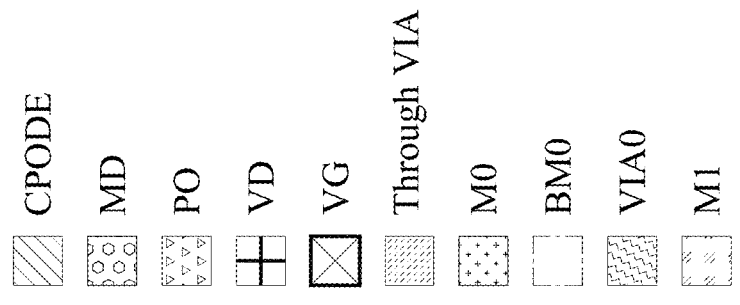
FIG. 19 is a view of a layout of a semiconductor device in accordance with some embodiments.

FIG. 19 is a view of a layout of a semiconductor device 1900 in accordance with some embodiments. In some embodiments, the semiconductor device 1900 is an inverter configured to provide an output to and receive an input from a plurality of through vias. In some embodiments, the semiconductor device 1900 is configured to have a D12 driving capacity. The semiconductor device 1900 includes a conductive mesh 1910 on a backside of a substrate. The conductive mesh 1910 is elected connected to a plurality of through vias 1920 to electrically connect to a conductive line 1940 by corresponding vias 1930. The semiconductor device 1900 further includes a connection 1950 to a shielding track, similar to the arrangement described in detail with respect to semiconductor device 1200A (FIG. 12A).

FIG. 20 is a view of cells of a semiconductor device 2000 in accordance with some embodiments. The semiconductor device 200 includes an output cell 2010 and an input cell 2020. The input cell 2020 is directly abutted to the output cell 2010 with no space between. The direct abutment between the input cell 2020 and the output cell 2010 is a result of inclusion of a conductive mesh (BM0) on the backside of the substrate. Directly abutting the input cell 2020 and the output cell 2010 means that gaps between cells are avoided and an overall device size of the semiconductor device 2000 is able to be reduced in comparison with another semiconductor device which does not include a backside conductive mesh and through via to provide electrical connections to front side components. One of ordinary skill in the art would understand the acronyms in FIG. 20 as follows shows place-and-route boundary (prBoundary) level, oxide diffusion (OD) level, polysilicon (PO) level, buried power (VB) level, backside metal 0 (BM0) level, and backside metal 0 pin (BM0 Pin) level of the layout of the semiconductor device 2000, in some embodiments.

FIG. 21 is a top view 2110 of a semiconductor device 2100 and a bottom view 2120 of a semiconductor device 2100 in accordance with some embodiments. The semiconductor device 2100 includes a plurality of receiver cells 2112. The semiconductor device 2100 further includes a plurality of relay cells 2114. The semiconductor device 2100 further includes a driver cell 2116. The cells are visible in the top view 2110 of the semiconductor device 2100. The cells are spaced apart from one another in a plane of the substrate on the front side of the substrate. The semiconductor device 2100 further includes a conductive mesh (BM0 and BM1) on the backside of the substrate. The conductive mesh is able to route power and signals to the various cells on the front side of the substrate using through vias. By arranging the conductive mesh on the backside of the substrate, the overall size of the semiconductor device 2100 is able to be reduced in comparison with other approaches because routing solutions which route signal lines around a periphery of a front side conductive mesh are reduced or avoided. One of ordinary skill in the art would understand the acronyms in FIG. 21 as follows place-and-route boundary (prBoundary) level, through VIA (TVIA) level, backside metal 0, (BM0) level, and backside metal 1 (BM1) level of the layout of the semiconductor device 2100, in some embodiments.

An aspect of this description relates to a semiconductor device. The semiconductor device includes a substrate. The semiconductor device further includes a conductive mesh on a first side of the substrate. The semiconductor device further includes an active region on a second side of the substrate, wherein the first side of the substrate is opposite to the second side of the substrate. The semiconductor device further includes a through via electrically connected to the conductive mesh, wherein the through via extends through the substrate. The semiconductor device further includes a contact structure on the second side of the substrate, wherein the contact structure is electrically connected to the active region, the contact structure is in direct contact with the through via, and the contact structure overlaps a top surface of the through via in a top view. In some embodiments, the contact structure overlaps less than an entirety of the top surface of the through via in the top view. In some embodiments, the contact structure directly contacts both the top surface of the through via and a sidewall of the through via. In some embodiments, the through via has a width, and a dimension of overlap of the contact structure over the top surface of the through via ranges from about 50% to about 80% of the width. In some embodiments, the semiconductor device further includes a second active region, wherein the through via is between the active region and the second active region, and the through via is electrically isolated from the second active region. In some embodiments, the through via includes a protective layer; and a conductive material, wherein the contact structure directly contacts the conductive material. In some embodiments, the protective layer is between the conductive material and the second active region. In some embodiments, a portion of the contact structure in direct contact with a sidewall of the conductive material is in direct contact with a top surface of the protection layer. In some embodiments, the semiconductor further includes a hardmask layer, wherein the hardmask layer is between the through via and the second active region. In some embodiments, a dopant type of the active region is a same dopant type as the second active region. In some embodiments, an entirety of the through via is offset from the active region in the top view.

An aspect of this description relates to a semiconductor device. The semiconductor device includes a substrate. The semiconductor device includes a conductive mesh on a first side of the substrate. The semiconductor device further includes an active region on a second side of the substrate, wherein the first side of the substrate is opposite to the second side of the substrate. The semiconductor device further includes a through via electrically connected to the conductive mesh, wherein the through via extends through the substrate. The semiconductor device further includes a gate structure on the second side of the substrate, wherein the gate structure is in direct contact with the through via, and the gate structure overlaps a top surface of the through via in a top view. In some embodiments, the through via includes a protective layer; and a conductive material, wherein the gate structure directly contacts the conductive material. In some embodiments, the protective layer is between the conductive material and the active region. In some embodiments, the through via has a width, and a dimension of overlap of the gate structure over the top surface of the through via ranges from about 50% to about 80% of the width. In some embodiments, the semiconductor device further includes a second active region, wherein the active region is between the through via and the second active region, and the gate structure extends over both the active region and the second active region.

An aspect of this description relates to a method of manufacturing a semiconductor device. The method includes defining an active region on a first side of a substrate. The method further includes depositing a hardmask layer over the active region. The method further includes patterning the hardmask to form an opening exposing a portion of the substrate. The method further includes etching the portion of the substrate to define a through via opening. The method further includes forming a through via in the through via opening. The method further includes removing the hardmask layer between a portion of the through via and the active region. The method further includes forming a contact structure in direct contact with the active region and the portion of the through via. In some embodiments, forming the through via includes depositing a protective layer in the through via opening; and depositing a conductive material on the protective layer. In some embodiments, removing the hardmask layer between the portion of the through via and the active region includes removing the protective layer from the portion of the through via. In some embodiments, forming the contact structure further includes forming the contact structure in direct contact with a top surface of the through via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a substrate;
a conductive mesh on a first side of the substrate;
an active region on a second side of the substrate, wherein the first side of the substrate is opposite the second side of the substrate;
a through via electrically connected to the conductive mesh, wherein the through via extends through the substrate, and the through via comprises a conductive material; and
a contact structure on the second side of the substrate, wherein the contact structure is physically between the through via and the active region, the contact structure is in direct contact with the through via, the contact structure overlaps a top surface of the through via in a top view, and the contact structure directly contacts both the top surface of the conductive material of the through via and a sidewall of the conductive material of the through via.

2. The semiconductor device of claim 1, wherein the contact structure overlaps less than an entirety of the top surface of the through via in the top view.

3. The semiconductor device of claim 1, wherein the contact structure is physically between the through via and the active region.

4. The semiconductor device of claim 1, wherein the through via has a width, and a dimension of overlap of the contact structure over the top surface of the through via ranges from about 50% to about 80% of the width.

5. The semiconductor device of claim 1, further comprising a second active region, wherein the through via is between the active region and the second active region, and the through via is electrically isolated from the second active region.

6. The semiconductor device of claim 5, wherein the through via comprises:
a protective layer.

7. The semiconductor device of claim 6, wherein the protective layer is between the conductive material and the second active region.

8. The semiconductor device of claim 6, wherein a portion of the contact structure is in direct contact with a sidewall of the conductive material and is in direct contact with a top surface of the protection layer.

9. The semiconductor device of claim 5, further comprising a hardmask layer, wherein the hardmask layer is between the through via and the second active region.

10. The semiconductor device of claim 5, wherein a dopant type of the active region is a same dopant type as the second active region.

11. The semiconductor device of claim 1, wherein an entirety of the through via is offset from the active region in the top view.

12. A semiconductor device comprising:
a substrate;
a conductive mesh on a first side of the substrate;
an active region on a second side of the substrate, wherein the first side of the substrate is opposite to the second side of the substrate;
a through via electrically connected to the conductive mesh, wherein the through via extends through the substrate; and
a gate structure on the second side of the substrate, wherein the gate structure is in direct contact with the through via, the gate structure overlaps a top surface of the through via in a top view, the gate structure extends beyond a periphery of the through via in a direction parallel to a surface of the second side of the substrate, and a portion of the gate structure is closer to the conductive mesh in a direction perpendicular to the surface of the second side of the substrate than a contact location between the gate structure and the through via.

13. The semiconductor device of claim 12, wherein the through via comprises:
a protective layer; and
a conductive material, wherein the gate structure directly contacts the conductive material.

14. The semiconductor device of claim 13, wherein the protective layer is between the conductive material and the active region.

15. The semiconductor device of claim 12, wherein the through via has a width, and a dimension of overlap of the gate structure over the top surface of the through via ranges from about 50% to about 80% of the width.

16. The semiconductor device of claim 12, further comprising a second active region, wherein the active region is between the through via and the second active region, and the gate structure extends over both the active region and the second active region.

17. A semiconductor device comprising:

a substrate;

a routing structure on a first side of the substrate;

a plurality of active regions on a second side of the substrate, wherein the first side of the substrate is opposite to the second side of the substrate;

a through via electrically connected to the routing structure, wherein the through via extends through the substrate between adjacent active regions of the plurality of active regions; and a contact structure on the second side of the substrate, wherein the contact structure is in direct contact with a top surface of the through via, and the contact structure is in direct contact with a sidewall of a first active region of the plurality of active regions.

18. The semiconductor device of claim 17, wherein the contact structure overlaps the first active region of the plurality of active regions.

19. The semiconductor device of claim 17, wherein the through via is electrically isolated from at least one of the plurality of active regions.

20. The semiconductor device of claim 17, wherein the contact structure is a gate contact, and the semiconductor device further comprises:

a second gate contact aligned with the gate contact in a first direction parallel to the second side of the substrate, and the second gate contact is spaced from the gate contact in the first direction.

\* \* \* \* \*